(12) United States Patent
Przydatek et al.

(10) Patent No.: US 6,397,155 B1
(45) Date of Patent: May 28, 2002

(54) METHOD AND APPARATUS FOR AUTOMATICALLY CONTROLLED GAIN SWITCHING OF MONITORS

(75) Inventors: Piotr B. Przydatek; Rene T. Jonker, both of British Columbia (CA)

(73) Assignee: Power Measurement Ltd., British Columbia (CA)

( * ) Notice: Subject to any disclaimer, the term of this patent is extended or adjusted under 35 U.S.C. 154(b) by 0 days.

(21) Appl. No.: 09/369,870

(22) Filed: Aug. 9, 1999

(51) Int. Cl.$^7$ ................................................ G01R 21/00
(52) U.S. Cl. ............................ 702/61; 702/62; 702/65; 324/142; 361/80
(58) Field of Search .............................. 702/60, 61, 62, 702/65, 66; 324/142, 132; 361/80; 707/3, 9

(56) References Cited

U.S. PATENT DOCUMENTS

| | | |
|---|---|---|
| 4,077,061 A | 2/1978 | Johnston et al. ............... 702/58 |
| 4,156,280 A | 5/1979 | Griess .......................... 702/58 |
| 4,240,149 A | 12/1980 | Fletcher et al. ............... 702/60 |

(List continued on next page.)

FOREIGN PATENT DOCUMENTS

CA  2299044 A1 * 2/2001 ........... G01R/21/00

OTHER PUBLICATIONS

"QUAD4® Plus and MAXsys™ Multifunction Electronic Meters and IEDS," On–Line User Guide, *QUAD4 Plus/MAXsys Products User's Guide*, Rev. 1.01, pp. 1–1–1–4; 1–13–1–15; 4–100, 4–107–4•.

"QUAD4® Plus and MAXsys™ Multifunction Electronic Meters and IEDS", On–Line User Guide Product Definitions, *QUAD4 Plus/MAXsys Products User's Guide*, Rev.1.01, pp. DEF–1–DEF–13.

"Protective Relaying Theory and Applications," edited by Walter A. Elmore, pp. 17–37 (1994).
"The world is changing. The old answers no longer apply," *Schlumberger*, Bulletin.
"Series PM170 Powermeters," *SATEC*, Bulletin.
"System 270 Powermeter," *SATEC*, Bulletin.
"RPM090 Digital Transducer," *SATEC*, Bulletin.
"Series 290 Power Monitoring System," *SATEC*, Bulletin.
"PM290HD Powermeter With Harmonic Analysis," *SATEC*, Bulletin.
"AX–7 Analog Expander," *SATEC*, Bulletin.
"Application Software, Professional Systems For Energy Control And Management," *SATEC*, Bulletin.

(List continued on next page.)

*Primary Examiner*—Kamini Shah
(74) *Attorney, Agent, or Firm*—Brinks Hofer Gilson & Lione

(57) ABSTRACT

A method and apparatus for automatically controlling gain switching of a monitor. To automatically control gain switching, an electronic circuit splits an input channel into a plurality of gain channels. The plurality of gain channels are simultaneously sampled. Thereafter, the processor accesses a present buffer of a first gain channel. The present buffer contains a predetermined amount of samples which represent the input channel. Next, the processor determines whether at least one of the samples contained in the present buffer is saturated. If at least one of the samples is saturated, the processor selects an alternate gain channel. Otherwise, if none of the samples is saturated, the processor determines whether a previous buffer of the first gain channel is saturated. If none of the samples from the previous buffer are saturated, the DSP selects the first gain channel. Otherwise, the DSP selects the alternate gain channel. Thereafter, the samples are processed from more than one of the plurality of gain channels to calculate power parameters.

38 Claims, 14 Drawing Sheets

Microfiche Appendix Included
(7 Microfiche, 209 Pages)

U.S. PATENT DOCUMENTS

| Patent No. | | Date | Inventor | Class |
|---|---|---|---|---|
| 4,345,311 | A | 8/1982 | Fielden | 702/62 |
| 4,365,302 | A | 12/1982 | Elms | 702/61 |
| 4,388,611 | A | 6/1983 | Haferd | 702/61 |
| 4,455,612 | A | 6/1984 | Girgis et al. | 706/294 |
| 4,459,546 | A | 7/1984 | Arrington et al. | 324/142 |
| 4,463,311 | A | 7/1984 | Kobayashi | 324/142 |
| RE31,774 | E | 12/1984 | Fletcher et al. | |
| 4,568,934 | A | 2/1986 | Allgood | 340/870.02 |
| 4,612,617 | A | 9/1986 | Laplace, Jr. et al. | 702/60 |
| 4,642,564 | A | 2/1987 | Hurley | 324/132 |
| 4,663,587 | A | 5/1987 | Mackenzie | 318/762 |
| 4,672,555 | A | 6/1987 | Hart et al. | 700/276 |
| 4,715,000 | A | 12/1987 | Premerlani | 702/210 |
| 4,783,748 | A | 11/1988 | Swarztrauber et al. | 702/62 |
| 4,794,369 | A | 12/1988 | Haferd | 341/66 |
| 4,837,504 | A | 6/1989 | Baer et al. | 324/42 |
| 4,839,819 | A | 6/1989 | Begin et al. | 702/62 |
| 4,878,142 | A | 10/1989 | Bergman et al. | 361/180 |
| 4,878,185 | A | 10/1989 | Brand et al. | 361/80 |
| 4,884,021 | A | 11/1989 | Hammond et al. | 324/142 |
| 4,901,221 | A | 2/1990 | Kodosky et al. | 345/771 |
| 4,914,568 | A | 4/1990 | Kodosky et al. | 345/763 |
| 4,979,122 | A | 12/1990 | Davis et al. | 702/61 |
| 5,017,860 | A | 5/1991 | Germer et al. | 324/142 |
| 5,059,896 | A | 10/1991 | Germer et al. | 324/142 |
| 5,061,890 | A | 10/1991 | Langini | 324/107 |
| 5,081,413 | A | 1/1992 | Yamada et al. | 324/142 |
| 5,122,735 | A | 6/1992 | Porter et al. | 324/142 |
| 5,132,610 | A | 7/1992 | Ying-chang | 324/142 |
| 5,151,866 | A | 9/1992 | Glaser et al. | 702/66 |
| 5,155,836 | A | 10/1992 | Jordan et al. | 703/23 |
| 5,212,441 | A | 5/1993 | McEachern et al. | 324/142 |
| 5,224,011 | A | 6/1993 | Yalla et al. | 361/93.2 |
| 5,224,054 | A | 6/1993 | Wallis | 702/60 |
| 5,233,538 | A | 8/1993 | Wallis | 702/62 |
| 5,243,536 | A | 9/1993 | Bradford | 702/60 |
| 5,243,537 | A | 9/1993 | Neumann | 702/66 |
| 5,245,275 | A | 9/1993 | Germer et al. | 324/142 |
| 5,247,454 | A | 9/1993 | Farrington et al. | 324/142 |
| 5,258,704 | A | 11/1993 | Germer et al. | 324/142 |
| 5,262,715 | A | 11/1993 | King et al. | 324/141 |
| 5,270,640 | A | 12/1993 | Kohler et al. | 324/772 |
| 5,301,121 | A | 4/1994 | Garverich et al. | 702/60 |
| 5,391,983 | A | 2/1995 | Lusigman et al. | 324/142 |
| 5,414,812 | A | 5/1995 | Filip et al. | 707/103 |
| 5,426,780 | A | 6/1995 | Gerull et al. | 707/3 |
| 5,481,700 | A | 1/1996 | Thuraisingham | 707/9 |
| 5,498,956 | A | 3/1996 | Kinney et al. | 324/142 |
| 5,537,029 | A | 7/1996 | Hemminger et al. | 324/142 |
| 5,548,527 | A | 8/1996 | Hemminger et al. | 702/62 |
| 5,549,089 | A | 8/1996 | Snell et al. | 123/352 |
| 5,555,508 | A | 9/1996 | Munday et al. | 702/60 |
| 5,627,759 | A | 5/1997 | Bearden et al. | 702/62 |
| 5,631,843 | A | 5/1997 | Munday et al. | 700/286 |
| 5,650,936 | A | 7/1997 | Loucks et al. | 702/62 |
| 5,736,847 | A | 4/1998 | Van Doom et al. | 324/142 |
| 5,828,576 | A | 10/1998 | Loucks et al. | 702/65 |

OTHER PUBLICATIONS

"Power Monitoring And Analysis Systems," *SATEC*, Bulletin.

"PM–295 Powermeter / Harmonic Analyzer," *SATEC*, Bulletin.

"PM 295 Power Monitoring System with Harmonic Analysis," *SATEC*, Bulletin.

"PM 170M Powermeter—with KVA Measurements," *SATEC*, Bulletin.

"Vector Electricity Meter with the Site Genie™ Monitor," *General Electric*.

"VECTRON® SVX Solid–State Polyphase Meters," *Schlumberger*, Bulletin 11314 (Mar. 1996).

"MAXsys® 2510 Substation/High–End Direct Access Meter," *Siemens*, Bulletin.

"MAXsys® 2410 Direct Access Meter,"*Siemens*, Bulletin.

"AIN ALPHA® Meter For IEC Standards," *ABB Information Systems*, Bulletin.

"ALPHA Stars™, National Wireless Communications for Remote Metering," *ABB Information Systems*, Bulletin.

"AIN Alpha, High Function Multi–Tariff Solid State Electricity Meter," *ABB Network Partner*, PB 42–280–lb, pp. 1–20.

"MARK–V Digital True RMS Energy Meter," *TransData, Inc.*, Bulletin.

"MAXsys®—PSI," *Siemens*, Bulletin.

"MeterView™ Software Environment . . . , . . . Instant Access to Maxsys™ Meter Information," *Siemens*, D00024D (1997).

"MAXsys®—Multi–Access Metering And Control," *Siemens*, Bulletin.

"MAXsys® For Energy Providers," *Siemens*, Bulletin.

QUAD4® Plus and MAXsys® Meters and IEDs, *Siemens*, QUAD2DSQ (1998).

The QUAD4® Plus Solid–State Meter, *PSI*, Bulletin.

"kV Telephone Modem," *General Electric*, Bulletin.

"kV A–Base Meters," *General Electric*, Bulletin.

"kV Class 320 Meters," *General Electric*, Bulletin.

"EnergyAxis™ Customer Site Metering System For On–Site Metering and Power Analysis,", *ABB Information Systems*, Bulletin (1998).

"8500 ION® Direct Access Billing Meter," *8500 ION™*, Power Measurement, Bulletin (Aug. 11, 1998).

"7700 ION® 3–Phase Power Meter, Analyzer and Controller," *7700 ION™*, Power Measurement, Bulletin (Apr. 22, 1998).

"American National Standard for Electric Meters—Code for Electricity Metering," *American National Standard*, Document ANSI C12.1 (1995).

"American National Standard for Electromechanical Watthour Meters," *The Institute of Electrical and Electronics Engineers, Inc..*, ANSI C12 (1987) (Revision of ANSI C12–10–1987).

"American National Standard for Electronic Time–of–Use Registers for Electricity Meters," *The Institute of Electrical and Electronics Engineers, Inc.*, ANSI C12 (Revision of ANSI C12 13–1985) (1991).

"American National Standard for Solid–State Electricity Meters," *The Institute of Electrical and Electronics Engineers, Inc.*, ANSI C12.16 (1991).

"American National Standard for Electricity Meters 0.2 and 0.5 Accuracy Classes," *American National Standards*, ANSI C12.20 (1998).

"ISO—Specification MTR1–96, Engineering Specification For Polyphase Solid–State Electricity Meters For Use On The ISO Grid," Exhibit A, pp. 1–42 (1997).

"Specifications For Approval Of Type of Electricity Meters, Instrument Transformers And Auxiliary Devices," *Consumer and Corporate Affairs Canada*.

International Standard, Alternating current static watt–hour meters for active energy (classes 0,2 S and 0,5 S), *International Electrotechnical Commission*, second edition (1992).

"Meter–Mounting Devices, Industrial Products," *Canadian Standards Association*, C22.2 No. 115–M (1989).

"Alternating–Current Electricity Metering, Electric Power Systems and Equipment," *Canadian Standards Association*, CAN3–C17–M (1984).

International Standard, Amendment 1 to Publication 868 (1986), *International Electrotechnical Commission*, Modification 1 (1986).

"International Standard, Electromagnetic Compatibility (EMC)—Part 4: Testing and measurement techniques—Section 15: Flickermeter—Functional and design specifications," *International Electrotechnical Commission*, 61000 4–15 (1997).

"Measurement Guide for Voltage Characteristics—Electricity Product Characteristics and Electromagnetic Compatibility," 230.02 *Norcomp, Unipede* (1995).

"Voltage characteristics of electricity supplied by public distribution systems," *BSI Standards*, 50160 (1995).

"Minutes of the 7th Meeting, Distribution Committee," *EEI*, 1998.

* cited by examiner

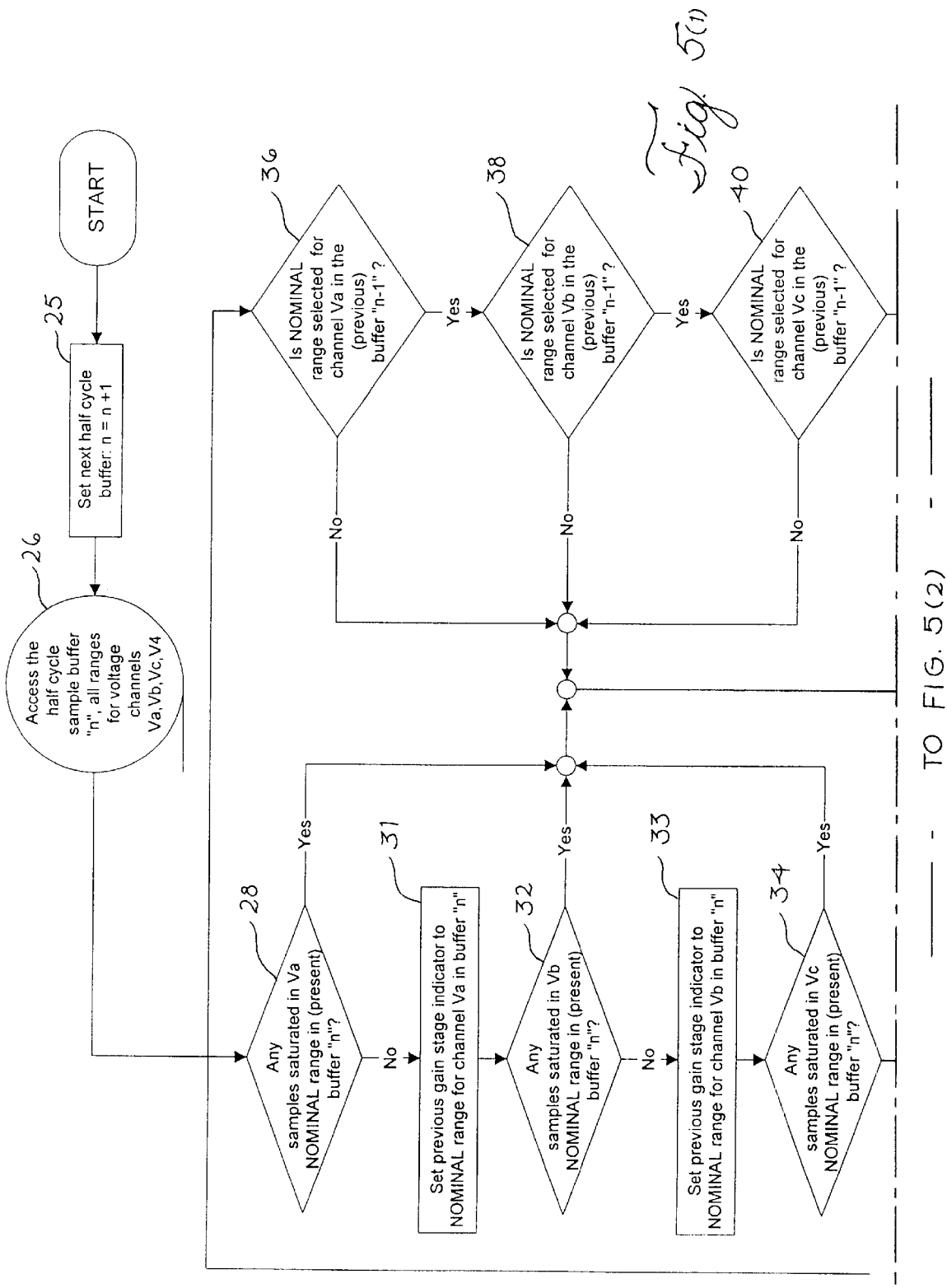

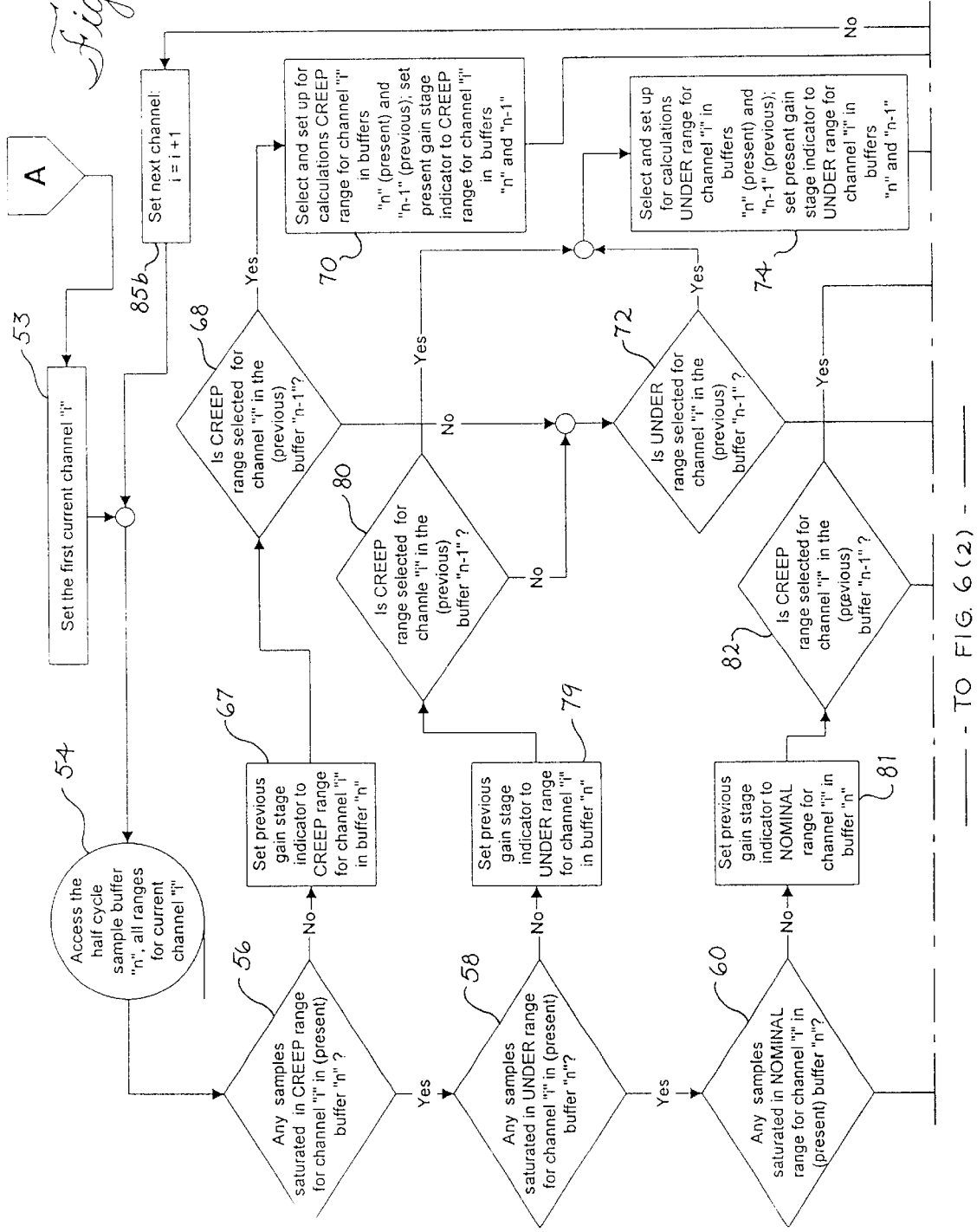

METHOD AND APPARATUS FOR AUTOMATICALLY CONTROLLED GAIN SWITCHING OF MONITORS

CROSS REFERENCE TO RELATED APPLICATIONS

The following co-pending and commonly assigned U.S. patent applications have been filed on the same date as the present application. All of these applications relate to and further describe other aspects of the embodiments disclosed in the present application and are all herein incorporated by reference.

U.S. Pat. application Ser. No. 09/370,317, "REVENUE METER WITH POWER QUALITY FEATURES", filed Aug. 9, 1999

U.S. Pat. application Ser. No. 09/371,833, "A-BASE REVENUE METER WITH POWER QUALITY FEATURES", filed Aug. 9, 1999

U.S. Pat. application Ser. No. 09/370,695, "REVENUE METER WITH GRAPHIC USER INTERFACE", filed Aug. 9, 1999

U.S. Pat. application Ser. No. 09/370,686, "REVENUE METER BLADE ASSEMBLY AND METHOD OF ATTACHMENT", filed Aug. 9, 1999

U.S. Pat. application Ser. No. 09/370,863, "A POWER SYSTEM TIME SYNCHRONIZATION DEVICE AND METHOD FOR SEQUENCE OF EVENT RECORDING", filed Aug. 9, 1999

U.S. Pat. application Ser. No. 09/370,696, "EXTERNAL COMMUNICATIONS INTERFACE FOR A REVENUE METER", filed Aug. 9, 1999

U.S. Pat. application Ser. No. 09/370,757, "A KEYPAD FOR A REVENUE METER", filed Aug. 9, 1999.

REFERENCE TO MICROFICHE APPENDIX

A microfiche appendix, Appendix A, is included of a computer program listing. The total number of microfiche is 6. The total number of frames is 186. A second microfiche appendix, Appendix B, is also included of schematic diagrams. The total number of microfiche is 1 and the total number of frames is 23.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

This present invention generally relates to meters and monitors of the type that measure power consumption and/or power quality. More specifically, the present invention relates to an automatic gain switching of such meters and monitors.

BACKGROUND OF THE INVENTION

In a typical electrical distribution system, electrical energy is generated by an electrical supplier or utility company and distributed to consumers via a power distribution network. The power distribution network is the network of electrical distribution wires which link the electrical supplier to its consumers. Typically, electricity from a utility is fed from a primary substation over a distribution cable to several local substations. At the local substations, the supply is transformed by distribution transformers from a relatively high voltage on the distributor cable to a lower voltage which is supplied to the end consumer. From the substations, the power is provided to industrial users over a distributed power network that supplies power to various loads. Such loads may include, for example, various power machines used by the end consumer.

At the consumer's facility, there will typically be a meter connected between the consumer and the power distribution network to measure the consumer's power consumption and/or power quality. The revenue meter is an electrical energy measurement device which accurately measures the amount of electrical energy flowing to the consumer from the supplier. The amount of electrical energy measured by the meter is then used to determine the amount for which the energy supplier should be compensated.

Typically, the electrical energy is delivered to the consumers as an alternating current (AC) voltage that approximates a sine wave over a time period. The term alternating waveform generally describes any symmetrical waveform, including square, sawtooth, triangular, and sinusoidal waves, whose polarity varies regularly with time. The term AC (i.e., alternating current), however, almost always means that the current is produced from the application of a sinusoidal voltage, i.e., AC voltage. The expected frequency of the AC voltage, e.g., 50 Hertz (Hz), 60 Hz, or 400 Hz, is usually referred to as the fundamental frequency. Integer multiples of this fundamental frequency are often referred to as harmonic frequencies.

While the fundamental frequency is the frequency that the electrical energy is expected to arrive with, various distribution system and environmental factors can distort the fundamental frequency, i.e., harmonic distortion, can cause spikes, surges, or sags, and can cause blackouts, brownouts, or other distribution system power quality problems. These problems can greatly affect the quality of power received by the power consumer at its facility or residence as well as make difficult an accurate determination of the actual energy delivered to the consumer.

In order to solve these problems, revenue meters have been developed to provide improved techniques for accurately measuring the amount of power used by the consumer so that the consumer is charged an appropriate amount and the utility company receives appropriate compensation for the power delivered and used by the consumer. Examples of such metering systems are well known in the art.

In addition, power monitors, and revenue meters with power monitoring capabilities, provide information about the quality of the power, i.e., frequency and duration of blackouts, brownouts, harmonic distortions, surges, sags, swells, imbalances, huntings, chronic overvoltages, spikes, transients, line noise, or the like, received by a power consumer at a particular consumer site. Blackouts, brownouts, harmonic distortions, surges, sags, swells, imbalances, huntings, chronic overvoltages, spikes, transients and line noise are all examples of power quality events. As utility companies become more and more deregulated, these companies will likely be competing more aggressively for various consumers, particularly heavy power users, and the quality of the power received by the power consumer is likely to be important. This, in turn, means that accurate and detailed reporting and quantification of power quality events and overall power quality will become more and more important as well.

For example, one competitive advantage that some utility companies may have over their competitors could be a higher quality of the power supplied to and received by the consumer during certain time periods. One company may promote that it has fewer times during a month that power surges reached the consumer causing potential damage to computer systems or the like at the consumer site. Another company may state that it has fewer times during a month when the voltage level delivered to the consumer was not within predetermined ranges which may be detrimental to electromagnetic devices such as motors or relays. Previous revenue accuracy meters which provide for measuring quality of power in general lack the necessary accuracy and power quality monitoring features to provide the consumer and the power utility with the needed information.

Problems occur since power monitors often are called upon to cover a wide range of voltage and current, such as 0 to 1000 Volts (V) Root Mean Square (RMS) and 0 to 50 Amps (A) RMS. To handle the wide range of voltage and current, one known solution is to include a mechanical or electronic switch that interchanges between different voltage and current ranges of the meter. Such switching is commonly referred to as gain switching. For example, if an input voltage exceeds the meter setting, the switch is changed to a different gain setting. The mechanical or electronic switching of the power monitor, however, may cause samples to be missed since no samples above the range are accurately recorded until the power monitor is switched.

Another known solution used to accommodate a wide range of input voltage and current is to utilize an Analog to Digital Converters (ADC) having a high bit count that handles a wide range of voltage and current. While power monitors commonly use an ADC with a bit count of 12 bits or less, ADCs with a bit count of 16 bits or higher are available. The 16 bit or higher ADCs, however, are prohibitively expensive in today's market. In addition, the overall system design becomes more complex and more costly due to signal/noise and data processing issues. At the bottom end of the bit range, a signal/noise ratio decreases, especially in industrial applications, to produce poor quality signals. The best resolution occurs at the top end of the ADC's bit range, e.g., 10 to 12 bits for a 12 bit ADC. High resolution and accuracy are especially important, for example, in applications such as a waveform recorder of the power monitor which allows a user to view line conditions in oscilloscope like form.

To obtain accurate readings, other known techniques include producing customized devices that accommodate a predetermined input range of voltage and current specified by the consumer. The customized power monitors contain amplifiers, for example, that provide gain to the signal to place the signal at the high bit range of the ADC. During the production process the amplifier circuit is adjusted to provide the required gain. It can be appreciated, however, that such customized devices increase manufacturing costs and complicate production procedures and logistics. In addition, the customized meters do not address problems caused by transients, such as voltage spikes and swells, that can exceed the normal operating conditions of the meter by several hundred percent. Thus, a voltage spike of, e.g., 1000 V RMS can saturate the ADC to its maximum bit count which indicates, e.g., only 120 V RMS. Such saturation of the ADC creates a clipped sample of the signal.

Accordingly, there is a need for a power monitor that is capable of monitoring, reporting and quantifying the quality of power with high level of detail and accuracy. Further, there is a need for a power monitor that guarantees no missing or clipped samples within a wide operating range of input voltages and currents. In addition, there is a need for a power monitor that eliminates production difficulties and costs associated with customized power monitors.

SUMMARY OF THE INVENTION

Such needs are met or exceeded by the present method and device for automatic control of gain switching. In general, device and method for gain switching improves power monitor and/or revenue meter operation within a wide range of input voltages and currents. Further, firmware controlled gain switching allows the power monitor to achieve an improved accuracy and waveform recording quality, and guarantees no missing or clipped samples in the waveform recordings.

More specifically, the preferred embodiment of the present invention includes an electronic circuit that splits an input channel into at least two gain channels. Thereafter, a processor controls analog to digital conversions to simultaneously sample all gain channels at a required sampling rate, (e.g., 128 samples per cycle) and reads the conversion results into buffers, preferably located in the processor's memory. Thereafter, the processor accesses a present buffer of a first gain channel. The present buffer contains a predetermined amount of samples which represent the input signal. Next, the processor determines whether at least one of the samples contained in the present buffer is saturated. If at least one of the samples is saturated, the processor selects an alternate gain channel. Otherwise, if none of the samples is saturated, the processor determines whether a previous buffer of the first gain channel is saturated. If none of the samples from the previous buffer are saturated, the processor selects the first gain channel. Otherwise, the processor selects the alternate gain channel. Thereafter, the samples are processed from more than one of the plurality of gain channels to calculate power parameters.

BRIEF DESCRIPTION OF THE DRAWINGS

Other features and advantages of the invention will be apparent to those skilled in the art with reference to the detailed description and the drawings, of which.

TABLE OF ACRONYMS

The following table aids the reader in determining the meaning of the several acronyms used to describe the present invention:

A=Amps.
AC=Alternating Current.
ADC=Analog to Digital Converter.
CPU=Central Processing Unit.
CTR=Current transducer.
DMA=Direct Memory Access.
DSP=Digital Signal Processor.
Hz=Hertz.
PTR=Potential or voltage transducer.
RMS=Root Mean Square.
V=Volts.

DETAILED DESCRIPTION OF THE INVENTION

The automatic controlled gain switching of the present invention is used by power monitoring devices and revenue meters, herein referred to as monitors. Automatic controlled gain switching improves accuracy and waveform recording quality compared to monitors that fail to use gain switching. In addition, the automatic controlled gain switching allows the monitor to record voltage and current transients of magnitudes exceeding normal power system operating conditions by several hundred percent. The gain switching of the present invention guarantees no missing or clipped samples in the waveform recordings and calculations.

Figure 1:
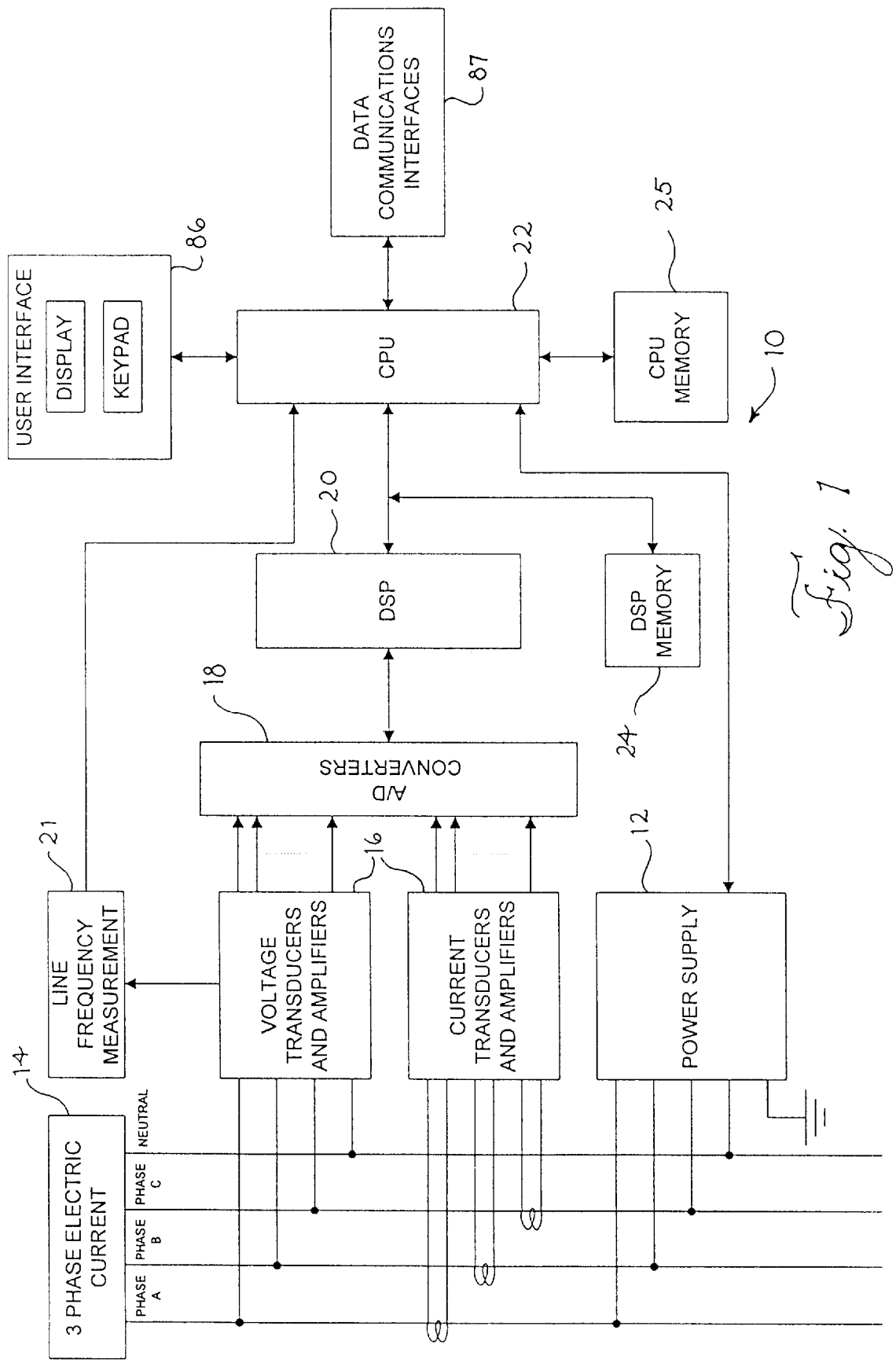
FIG. 1 depicts a block diagram of power event detection, quantification and reporting hardware of the preferred embodiment power monitor.

Referring to the drawings, and particularly FIG. 1, a monitor, generally indicated as 10, contains hardware components which can detect and report power quality events. Logically, the preferred monitor 10 is comprised of hardware, software, and firmware. FIG. 1 shows a typical hardware configuration where the monitor 10 is connected to a power supply 12 and a three phase electric circuit 14. It will be appreciated by those skilled in the art that the algorithms detailed herein can be executed by a variety of hardware configurations, all of which are known in the art. The power supply 12 of the preferred embodiment includes a very wide operating range true three phase power supply. This permits the monitor 10 to operate with different input voltage conditions without necessitating different hardware, which permits a utility to stock fewer monitor types in their inventory. The power supply 12 supplies power for the meter's electronics.

Exemplary voltage inputs include three phase 120–277 V RMS+/−20% (for a 4 wire Wye 9S connection) or 120–480 V RMS (for a 3 wire Delta 5S connection). Wye is a defined wiring system for three phase power where four power carrying conductors are used, one of which is a neutral conductor. Delta is a defined wiring system for three phase power utilizing three power carrying conductors. Either wiring system can include an extra safety ground conductor. Continuing with the power supply 12, multiphase operation also effectively reduces the power consumption of the monitor 10 by equally dividing monitor power requirements between each phase. In addition, true three phase operation provides the ability for the monitor 10 to continue normal operation with two out of three input phase loss (single phase operation) in a four wire Wye configuration and the loss of a single phase in a three wire delta configuration.

Figure 2:
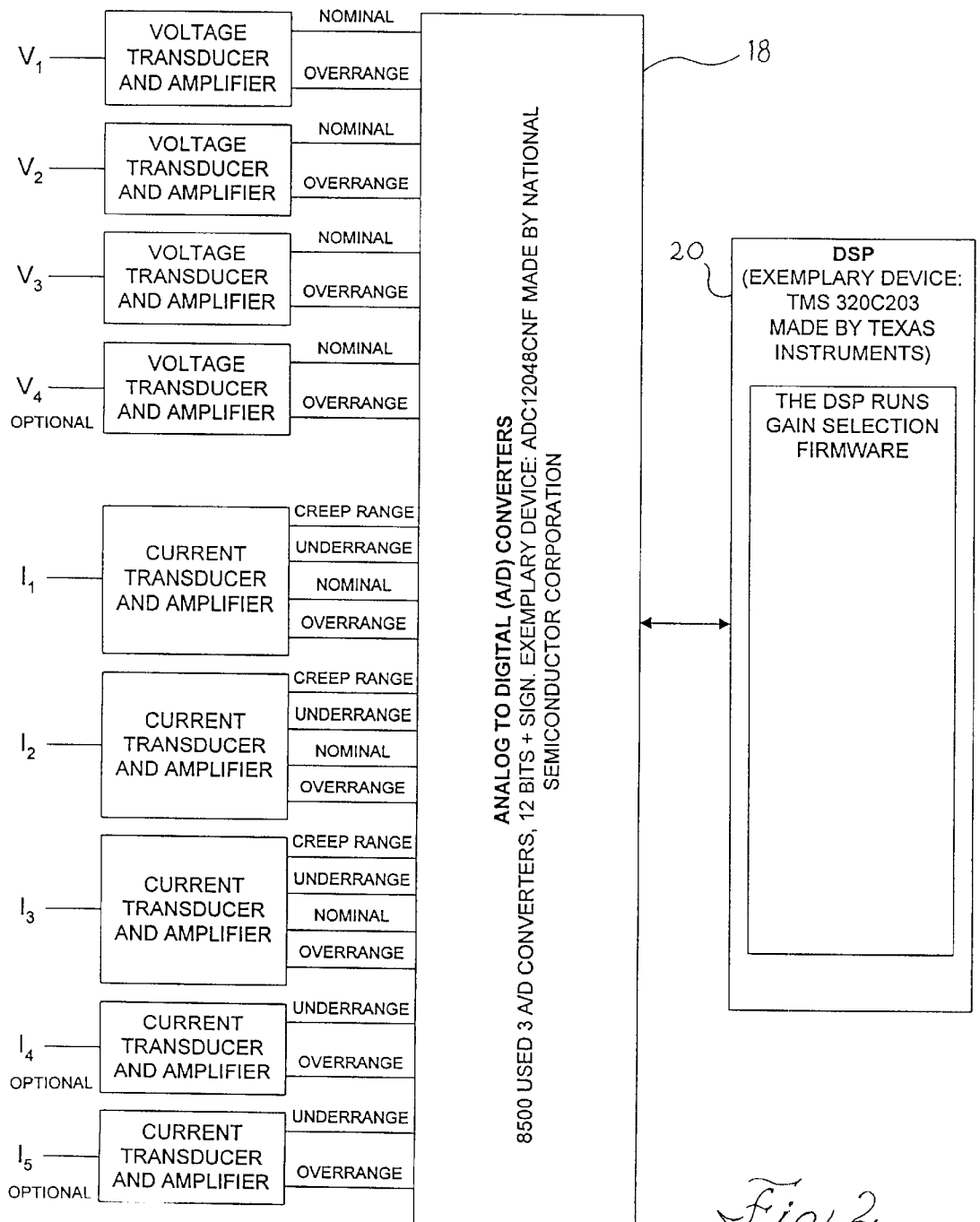
FIG. 2 shows voltage input channels internally split into two gain channels and current input channels internally split into four gain channels to accommodate the automatic gain switching power monitor of the present invention.

Referring also to FIG. 2, the monitor 10 contains transducers 16, including current transducers (CTR) and potential or voltage transducers (PTR) which sense current channels $I_1$, $I_2$, and $I_3$, and voltage channels Va, Vb, and Vc respectively, corresponding to each phase of the three phase input. In addition, auxiliary voltage $V_4$ and currents $I_4$ and $I_5$ arc input to the monitor to measure, for example, a neutral current, a ground current and a star point voltage in a three phase WYE system, respectively. Monitors equipped with the fourth current can directly measure, with high precision, the magnitude of the neutral or ground current. The ability to directly measure neutral or ground current ensures that the power system operates within safe limits. In addition, the fourth voltage and the fifth current can be used to monitor other current or voltage signals, e.g., corresponding to a load, auxiliary transducer output or other diagnostic measurement points in a system.

Figure 3:
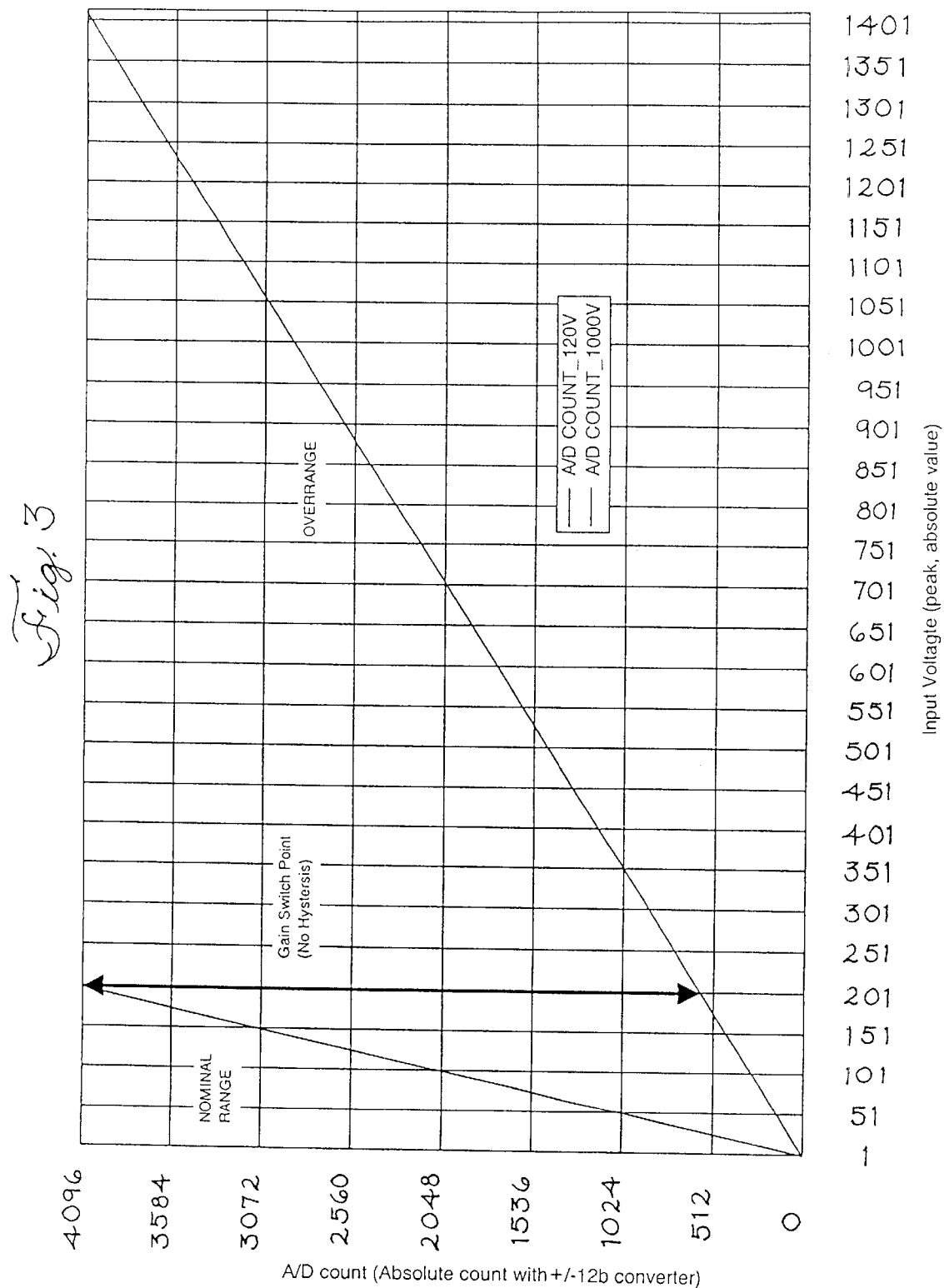
FIG. 3 depicts exemplary voltage input ranges for the voltage gain channels shown in FIG. 2.

Referring to FIGS. 2 and 3, the three phase voltage input channels Va, Vb, and Vc are internally split into two gain channels each, herein referred to as a nominal gain channel and an overrange gain channel. A two stage amplifier (not shown), for example, connects to the voltage channels to scale the input voltage and provide for different gain channels. An exemplary input peak voltage versus an Analog to Digital Converter (ADC) count is shown for the different gain channels. For the sake of simplicity, the absolute values are shown for the peak input voltages and the ADC counts. Thus, it can be appreciated that FIG. 3 also is applicable for the negative peak input voltages and ADC counts.

For a 12 bit ADC, an absolute value of the ADC count ranges from 0 to 4096. In the preferred embodiment, the nominal gain channel covers a voltage range of about 0 to 156 V RMS (221 V peak), and the overrange gain channel encompasses a range of about 0 to 1000 V RMS (1414 V peak) or greater. Artisans will appreciate that these voltage ranges and channels are implementation dependent and can be changed for other applications. In addition, it should be appreciated that switch points can vary from unit to unit due to tolerances in the electronic circuitry. These variations, however, do not adversely effect the overall gain switching of the present invention.

Note, as used herein, that the term ADC converter refers not only to a traditional A/D converters but also to a Time Division Multiplication ("TDM") based converter, or other converter which converts analog signals to digital signals. TDM is is a method of measuring instantaneous power over a wide range of input voltages. TDM is accomplished by taking a snapshot of the waveform of the incoming electrical signal and converting it to a square wave over time using a known algorithm. The area of this square wave is then proportional to the power at the time the snapshot was acquired. The snapshot or sample time is dependent on processor speed. An exemplary implementation of TDM is the Quad4-Plus Electric Meter manufactured by Process Systems, A division of Siemens Power and Transmission & Distribution, LLC, located in Raleigh, North Carolina which is described in the CD ROM specification for this product.

Figure 4:
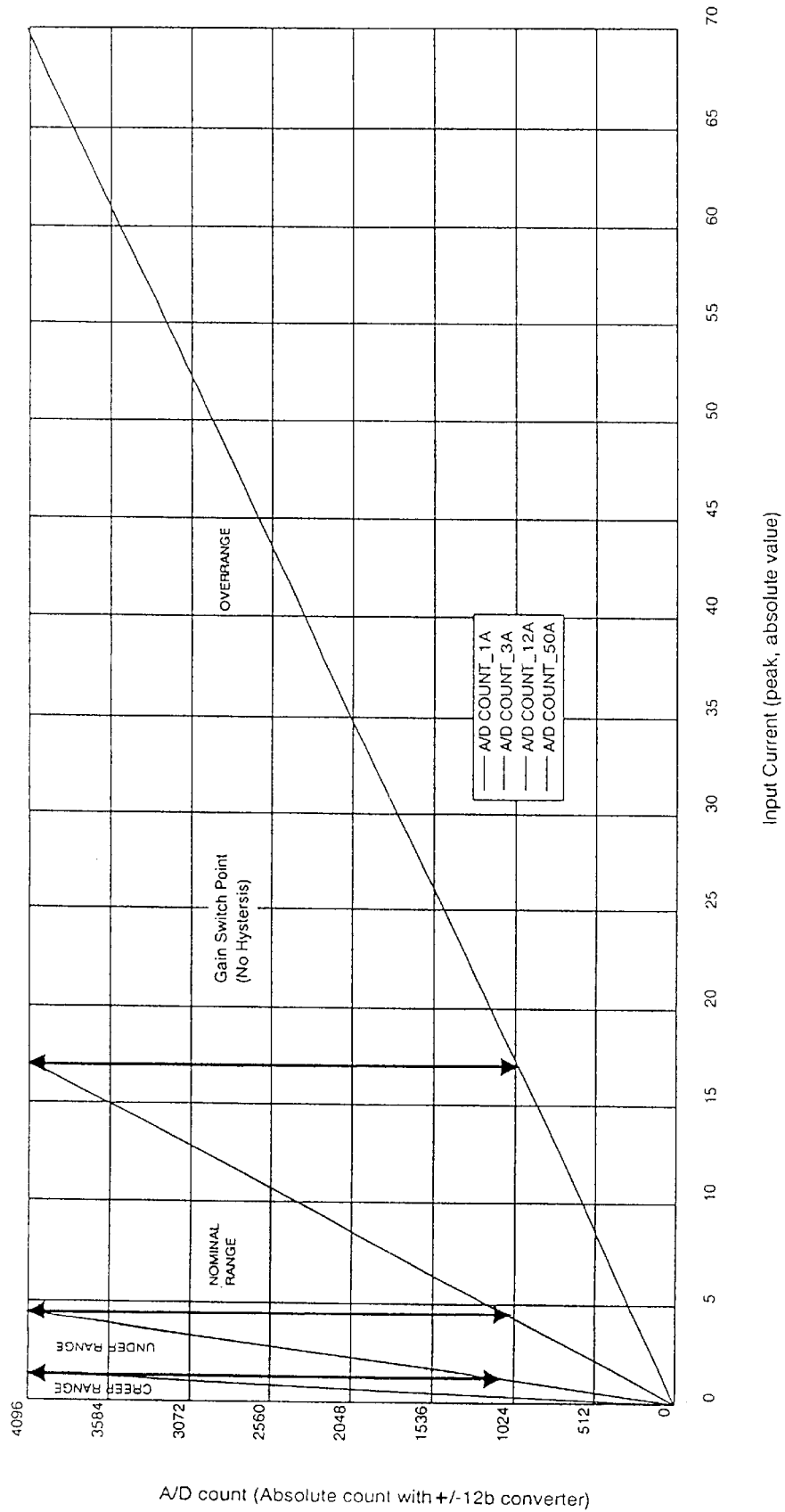
FIG. 4 depicts exemplary input current ranges for the input gain channels shown in FIG. 2.

Referring to FIGS. 2 and 4, the three phase current input channels $I_1$, $I_2$, and $I_3$ are internally split into four gain channels and scaled using four amplifiers connected in parallel, for example. Exemplary current gain channels are a creep gain channel, an underrange gain channel, a nominal range channel and an overrange gain channel. In addition, $I_4$ and $I_5$ are internally split and scaled into the underrange and overrange gain channels. Two gain channels, instead of four, are preferred for $I_4$ and $I_5$ to reduce costs by using only two gains since a highly accurate measurement of $I_4$ and $I_5$ are not required. An exemplary input peak current versus ADC count is shown in FIG. 4 for the different gain channels. For the 12 bit ADC, an absolute value of the ADC count ranges from 0 to 4096. In the preferred embodiment, the creep gain channel covers a current range of about 0 to 0.8 A RMS (1.13 A peak), the underrange gain channel encompasses about 0 to 3.125 A RMS (4.4 A peak), the nominal gain channel is about 0 to 12.5 A RMS (17.7 A peak), and the overrange gain channel covers a current range of about 0 to 50 A RMS (70.7 A peak). Artisans will appreciate that these current ranges and channels are implementation dependent and that other current ranges are possible. In addition, it should be appreciated that switch points can vary from unit to unit due to tolerances in the electronic circuitry. These variations, however, do not adversely affect the overall gain switching of the present invention.

Referring also to FIG. 1, the transducers 16 permanently connect, i.e., without mechanical switching, each gain channel signal to at least one ADC 18. The ADC samples the analog current and voltage in each phase for each gain channel of the electric circuit 14, and converts the analog signal to a digital signal for each gain channel. Thus, information is gathered for all gain channel signals at all times, even if the gain channel signal is saturated, to guarantee no missing or clipped samples.

In a preferred embodiment, the gain channel signals connect to an array of three ADCs 18 of the "12 bit plus sign" type with a count range from −4096 to 4096. Each ADC 18 samples up to eight channels simultaneously, where simultaneously is defined herein as within one hundred microseconds. Thus, a total of twenty four channels are sampled simultaneously. Preferably, at least one voltage gain channel and one current gain channel representing the same phase of the power system may be sampled simultaneously to preserve the phase relationship between the voltage and the current signals. When voltage and current are not measured simultaneously, the phase relationship of voltage and current signals is not preserved, which adversely affects the calculation of power and energy. Correction of phase errors induced by the sampling sequence is effective only when operating at the fundamental frequency. More preferably, all of the gain channels are sampled simultaneously.

Data from all of the sampled gain channels are stored to memory, whether or not the sample is saturated, as further described below. During half cycle task calculations, described below, a running average is calculated for unsaturated channels of the stored samples. Thereafter, during one second task calculations, described below, a weighted running average is calculated for the unsaturated channels.

During sampling, a Digital Signal Processor (DSP) 20 utilizes a sampling algorithm to control the array of the three simultaneously operating ADCs 18. An exemplary DSP is the TMS 320C203 manufactured by Texas Instruments, Inc., located in Dallas, Tex. The line frequency, e.g., 60 Hertz (HZ), is measured (block 21) and utilized by the CPU which calculates the sampling interval and transfers it via Direct Memory Access (DMA) to the DSP. The DMA method is described in a commonly assigned co-pending patent application to Rene T. Jonker, et al. entitled "Revenue Meter with Power Quality Features," Ser. No. 09/370,317, filed on Aug. 9, 1999 incorporated by reference herein. DMA transfer is preferred since such a transfer requires minimal external hardware to operate. Thus, there is no need for use of costly dual port memories, which results in significant cost savings. The DMA method also provides a higher overall data throughput with less CPU loading. Alternatively, other methods of sharing data between the CPU 22 and DSP 20 can also be used. In a preferred embodiment, the DSP 20 samples the voltage at a rate of 128 samples per cycle for input signal frequencies of 18 Hz to 72 Hz to achieve, e.g., a resolution of 434 micro-second for 18 Hz, 156 micro-second for 50 Hz, 130 micro-second resolution at 60 Hz, and 108 micro-second for 72 Hz. Generally resolution=[1/(input frequency*128)].

In addition, artisans will appreciate that sampling rates as low as 16 samples per cycle can be used, and that higher sampling rates such as 256 samples per cycle can also be used. The maximum sampling rate is limited by a processing power, an analog to digital converting speed limit of the ADC, and cost. Since more samples per cycle produce more information to allow better reconstruction of the signal, the minimum sampling rate is governed by a required accuracy of the monitor 10. It is found that 128 samples of each gain channel per cycle achieves the required accuracy and provides the best cost per performance ratio in today's market.

The ADC 18 outputs the samples for each gain channel to the DSP 20. The DSP 20 sorts the samples by gain channel, loads the sorted samples into corresponding sample buffers, and also sends the samples to a Central Processing Unit (CPU) 22 for further processing, described below. A preferable method for sending the samples to the CPU is via DMA. The CPU 22 manages and stores results for later user access.

The DMA data transfer uses the passive DMA capabilities of the DSP 20 and DMA controller functionality provided by the CPU 22. As described above, the DSP 20 executes the sampling algorithm and collects samples. The samples are sorted by channel and stored in sample buffers located in a designated SRAM memory 24. Each gain channel is associated with its own sample buffer that is at least five half cycles long. The buffer is deep enough so that the CPU 22 can access samples from the buffers after performing pre-calculations described below. In the preferred embodiment, six half cycle buffers are used for ease of implementation. In addition to these sample buffers, there are at least two pre-calculation buffers allocated for transferring pre-processed data between the CPU 22 and the DSP 20. An identical buffer arrangement exists in the CPU's DRAM memory 25.

Utilizing sample data stored in the sample buffers, the DSP 20 executes gain control of the present invention to provide for automatically controlled gain switching. Preferably, the present gain control algorithm is executed with firmware that resides in flash memory on the CPU 22 when the DSP 20 is powered down, and which is automatically downloaded into DSP operation memory when the monitor is powered up. Artisans will appreciate, however, that the present gain control algorithm can be implemented in other ways, for example, by using hardware or software.

Figure 5:
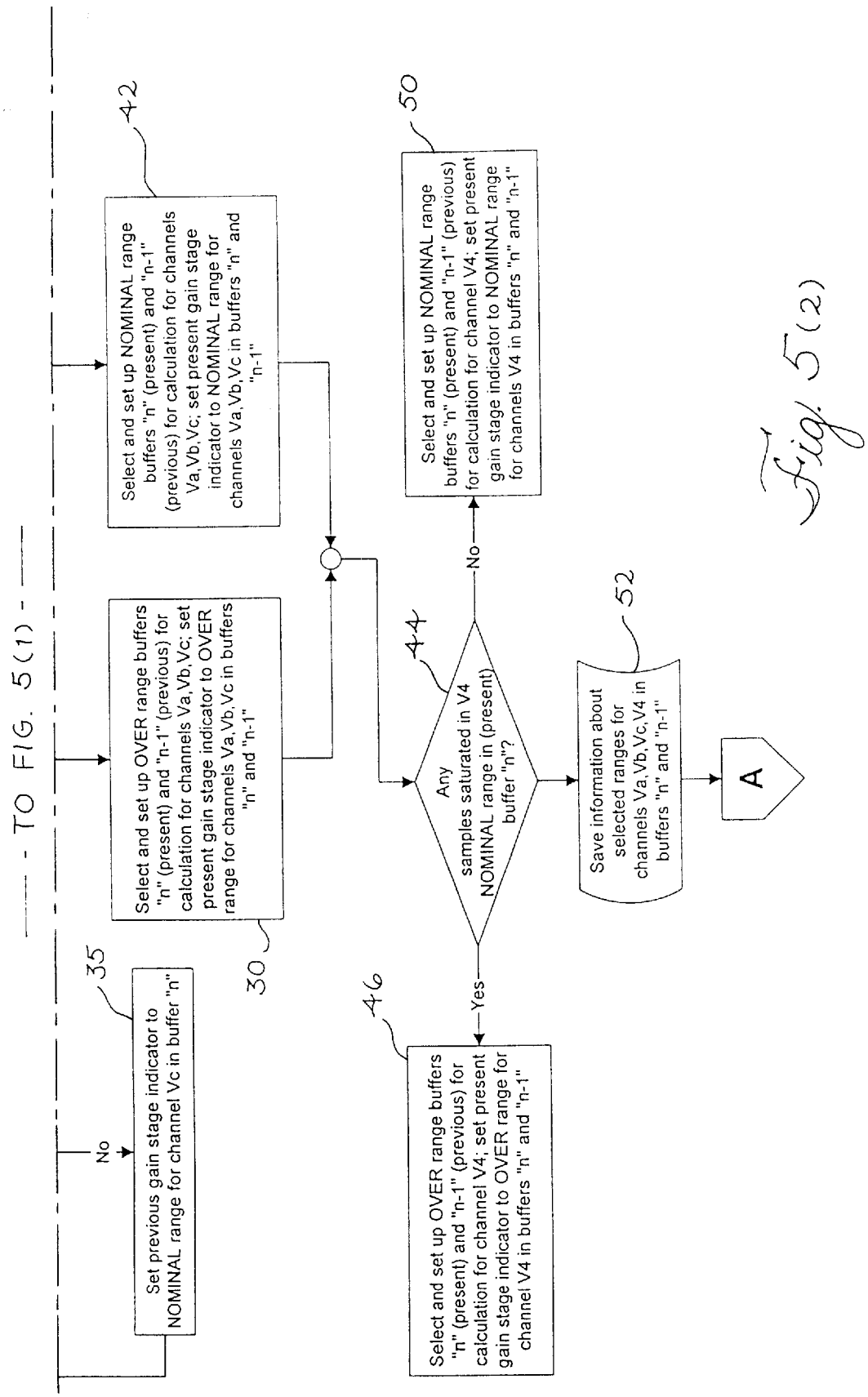
FIG. 5 shows a flow chart depicting a voltage channel gain control algorithm of the present automatically controlled gain switching power monitor.
Figure 6:
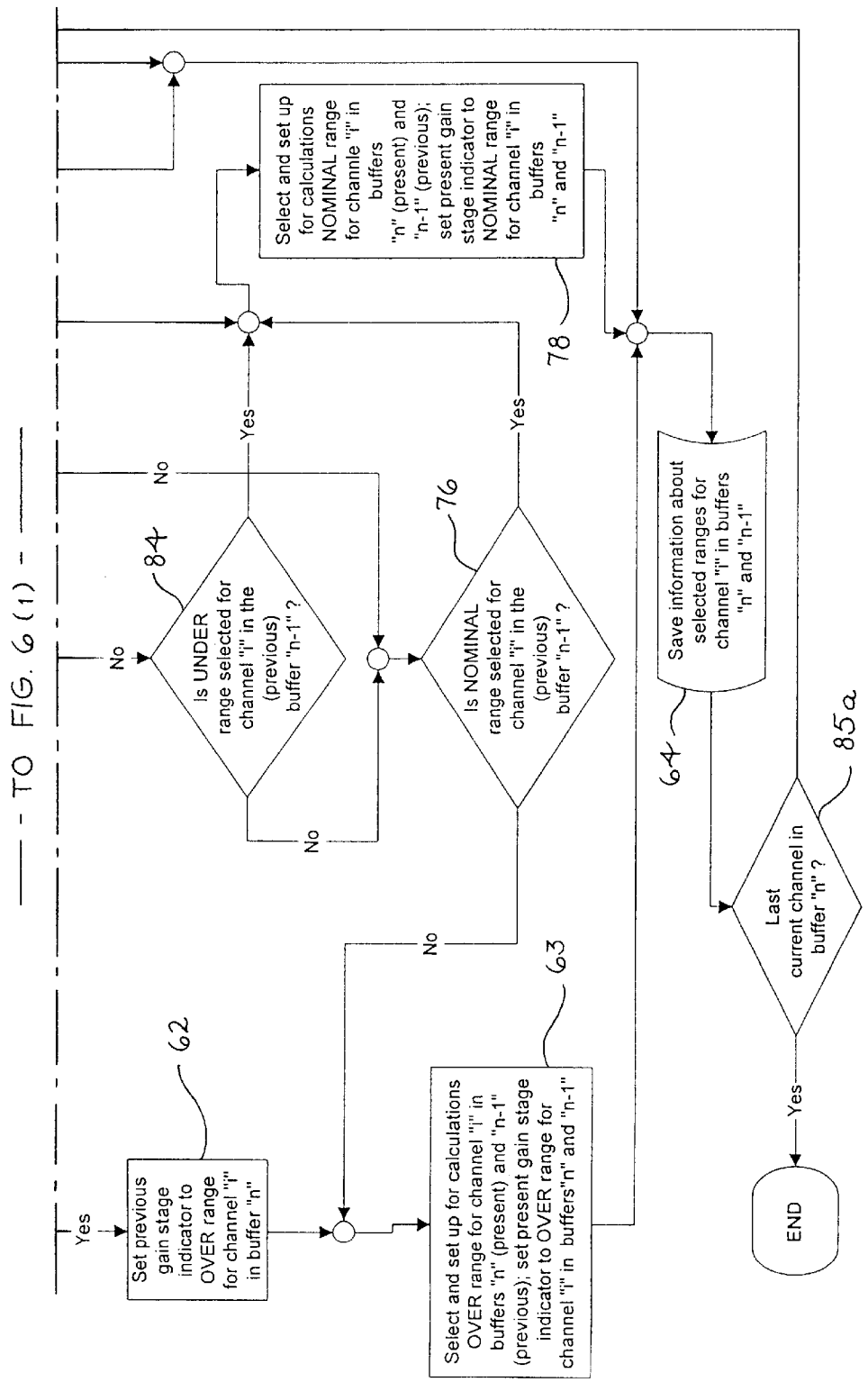
FIG. 6 shows a flow chart depicting a current channel gain control algorithm of the present automatically controlled gain switching power monitor.

Referring to FIGS. 5 and 6, the flowcharts represent the gain control algorithm of the present invention. In general, the DSP 20 scans all gain channels, sample by sample, to eliminate saturated channels. Moreover, the DSP 20 selects optimal gain channels, i.e., those that provide the best utilization of the ADC input voltage range for the present magnitude of signals. For example, for a twelve bit ADC, with a 0 to 5 input voltage, i.e., producing up to 4096 counts, the desired input signal level is as close to 5 V as possible. Signal levels of 5V or more result in ADC saturation at 4096 counts. Gain selection information is stored in an internal data structure on the DSP 20, for example, to signify the channels with the best ADC resolution for a predetermined time interval.

Referring to FIG. 5, a flowchart is shown that represents voltage gain control for the nominal and overrange voltage gain channels. The present gain control algorithm utilizes a one cycle wide sliding window to view samples from the three cycle wide sample buffers. While the sliding window is one cycle wide, it only advances in one-half cycle increments. Thus, when the sliding window advances, it covers a previous one-half cycle of samples and a present one-half cycle. Advancing the window one-half cycle at a time lends for a more stable output, e.g., by eliminating bounce and discontinuities, than if the window moved one cycle at a time. Further, the sliding window arrangement improves a response time of the meter since the gain control information is updated every one-half cycle instead of every cycle.

Thus, the gain control algorithm begins by shifting the sliding window one half cycle (block 25) to access the present voltage nominal samples and voltage overrange samples, for each voltage phase Va, Vb, and Vc (block 26). Thereafter, the DSP 20 determines whether any of the samples within the present one-half cycle are saturated in the Va nominal buffer (block 28). For a 12 bit ADC, a sample is saturated when the sample shows an ADC count of 4096. In the preferred embodiment, a sample is considered to be saturated when the sample manifests an ADC count of 4090 to 4096. Artisans will appreciate, however, that other counts can be used as a saturation level for the purpose of the present invention. If any samples are saturated, the DSP 20 sets the gain selection information to select the samples from the overrange sample buffer within the one cycle window for Va, Vb, and Vc (block 30).

In addition, the DSP 20 sets a previous-gain-stage indicator for each gain channel of this half cycle. During the next one-half cycle, the previous-gain-stage indicator represents the optimal range of this half cycle, which will then be the previous one-half cycle. As evidenced below, the DSP 20 checks the previous-gain-stage indicator to acquire optimal range information for the previous one-half cycle without rechecking all the samples in that cycle. In this manner, the previous-gain-stage indicator optimizes time and saves processing power.

If no samples are saturated within the present one-half cycle for the Va nominal sample buffer, the DSP 20 sets the previous-gain-stage indicator to nominal for channel Va (block 31). Thereafter, the DSP 20 determines whether any samples are saturated in the present one-half cycle Vb nominal buffers (block 32). If the Vb nominal buffer contains at least one saturated sample in the present nominal buffer, the DSP 20 selects the samples within the one cycle window for the overrange buffers of Va, Vb, and Vc (block 30). In addition, the DSP 20 sets the previous-gain-stage indicator to overrange (block 30). Otherwise, the DSP sets the previous-gain-stage indicator to nominal for channel Vb (block 33).

If no samples are saturated within the present one-half cycle for each of the Va, Vb, and Vc nominal buffers, then the DSP 20 sets the previous-gain-stage indicator to nominal for Vc (block 35). Thereafter, the DSP 20 determines whether the nominal gain channel was selected in the previous half cycle. To determine whether the nominal gain channel was selected, the DSP 20 checks a value of the previous-gain-stage indicator for the previous one-half cycle. If the previous-gain-stage indicator indicates the nominal range for each of Va, Vb, and Vc during the previous one-half cycle (blocks 36, 38, and 40), then the DSP 20 selects the samples within the one cycle window for the nominal buffers of Va, Vb, and Vc (block 42).

Otherwise, if any of the previous-gain-stage variables for Va, Vb, and Vc indicate that the nominal range was not selected in the previous one-half cycle (blocks 36, 38, and 40), then the DSP 20 selects the samples within the one cycle window for the overrange buffers of Va, Vb, and Vc (block 30). Thus, the DSP 20 selects Va, Vb, and Vc in the same gain range to facilitate the calculation of line to line voltages since less processing power is required to calculate the vector products when the gains exist in the same range. Artisans will appreciate, however, that it is possible to calculate line-to-line voltage without the same gain stage requirement.

In addition, the DSP 20 determines a gain range for voltage $V_4$ independent of Va, Vb, and Vc. After the DSP 20 selects the optimal gain channel for Va, Vb, and Vc, the DSP 20 determines whether any of the samples within the present one-half cycle are saturated in the $V_4$ nominal buffer (block 44). If any samples are saturated, the DSP 20 sets the gain selection information to select the samples from the overrange sample buffer within the one cycle window for $V_4$ (block 46). Moreover, the DSP 20 sets the previous-gain-stage indicator for $V_4$ to overrange.

If no samples are saturated within the present one-half cycle $V_4$ nominal buffer, then the gain selection algorithm determines whether the DSP 20 selected the nominal gain channel for $V_4$ in the previous one-half cycle (block 48), as discussed above. If the DSP 20 selected the nominal range in the previous one-half cycle, then the DSP 20 selects the samples within the one cycle window for the nominal buffers of $V_4$ (block 50). Otherwise, the DSP 20 selects the samples within the one cycle window for the overrange buffers of $V_4$ (block 46). Thereafter, the DSP 20 saves the gain selection information for Va, Vb, Vc, and $V_4$ to the DSP 20, for example, and the necessary data pointers (block 52). The saved information represents the optimal gain for the present one-half cycle and the optimal gain for the combination of the previous and present one-half cycles to be used in calculation tasks described below.

Similar to voltage $V_4$, the DSP 20 independently determines the optimal range for currents, such as $I_1$, $I_2$, $I_3$, $I_4$ and $I_5$, because having varying gain stages for each current results in more accurate measurements. Referring to FIG. 6, a flow chart represents the gain control algorithm for automatically selecting the optimal current gain channel for current. The algorithm begins by setting the first current channel (block 53) and accessing the latest one-half cycle current sample buffers for all gain stages (block 54), starting with current $I_1$, for example. The current channel selection portion of the algorithm repeats until the gain channel is determined for each current input channel.

Thus, for current $I_1$, the DSP 20 determines whether any samples within the one-half cycle are saturated for the present creep range buffer (block 56). If at least one of the samples is saturated, i.e., the ADC count indicates 4090 or more counts for a 12 bit ADC, the DSP 20 determines whether any samples are saturated within the current one-half cycle for the present $I_1$ underrange buffer (block 58). If at least one of the samples is saturated in this range, the DSP 20 determines whether any of the samples are saturated in the present nominal range buffer (block 60). If at least one of the samples is saturated, the DSP 20 selects the samples within the one cycle window for the overrange buffer of $I_1$, and sets the previous-gain-stage indicator to overrange (block 62). In addition, a present-gain-stage indicator is set to overrange (block 63). Thereafter, the DSP 20 saves the gain selection information and the necessary data pointers (block 64). The optimal gain for the present one-half cycle and the optimal gain for the combination of the previous and present one-half cycles are used in calculations described below.

If none of the samples are saturated in the present creep range buffer (block 56), the DSP 20 sets the previous-gain-stage indicator to creep (block 67), and determines whether the creep range was selected in the previous buffer (block 68). To determine whether creep was selected in the previous buffer, the DSP 20 checks a value of the previous-gain-stage indicator of $I_1$ for the previous one-half cycle. If the creep range was selected in the previous buffer, the DSP 20 selects the samples within the one cycle window for the creep buffer (block 70). Otherwise the DSP 20 determines whether the underrange was selected in the previous buffer (block 72). If the underrange was selected in the previous buffer, the DSP 20 selects the samples within the one cycle window for the underrange buffer (block 74). If not, the DSP 20 determines whether the nominal range was selected in the previous buffer (block 76). If the nominal range was selected in the previous buffer, the DSP 20 selects the samples within the one cycle window for the nominal buffer (block 78). Otherwise, the DSP 20 selects the samples within the one cycle window for the overrange buffer (block 63). In this manner, the DSP 20 determines the optimal range for current $I_1$, i.e., the range that produces the highest analog to digital count without containing any saturated samples.

If samples are saturated in the present creep range but not in the present underrange range (blocks 56 and 58), the DSP 20 sets the previous-gain-stage indicator to underrange for $I_1$, (block 79). In addition, the DSP 20 determines whether the creep range (block 80) or the underrange range (block 72) were selected in the previous buffer by checking a value of the previous-gain-stage indicator for the previous one-half cycle. If the creep range or the underrange range were selected in the previous buffer, the DSP 20 selects the samples within the one cycle window for the underrange buffer (block 74). If not, the DSP 20 determines whether the nominal range was selected in the previous buffer by checking a value of the previous-gain-stage indicator (block 76). If the nominal range was selected in the previous buffer, the DSP 20 selects the samples within the one cycle window for the nominal buffer (block 78). Otherwise, the DSP 20 selects the samples within the one cycle window for the overrange buffer (block 63).

Likewise, if samples are saturated in the present creep range and the present underrange buffer, but not the present nominal range buffer (blocks 56, 58, and 60), the DSP 20 sets the previous-gain-stage indicator to nominal for this half cycle (block 81). In addition, the DSP determines whether the creep range (block 82), the underrange range (block 84), or the nominal range (block 76) were selected in the previous buffer by checking a value of the previous-gain-stage indicator for the previous one-half cycle. If any of the creep range, the underrange range, or the nominal range were selected in the previous buffer, the DSP 20 selects the samples within the one cycle window for the nominal range buffer (block 78). Otherwise, the DSP 20 selects the one cycle window for the overrange buffer (block 63). The DSP 20 saves all the gain selection and data pointer information (block 64), and continues in this manner to determine the optimal gain channel for each current channel until no other current channels remain (block 85a). The current channels are processed, one by one, until no more current channels exist for the current half cycle (blocks 85a and 85b). Thereafter, the DSP 20 shifts the window one-half cycle and the above process is repeated for all of the voltage and the current channels (block 25).

Referring again to FIG. 1, the DSP 20 supplies the results of the gain selection information and pre-calculation information to the CPU 22 via the DMA transfers described above. Pre-calculation information includes, but is not limited to, half-cycle voltage and current RMS, active, reactive, and apparent power values. An exemplary CPU is the Power PC MPC821, manufactured by Motorola, Inc., located in Schaumburg, Ill. The CPU 22 then performs half cycle and one second tasks, described below, and supplies the results to the user via a user interface 86. In a preferred embodiment, the half cycle task utilizes all the samples stored in the buffer, i.e., the samples which represent one half cycle of the input waveform. It should be appreciated, however, that the calculations can be performed with a lower number of samples, e.g., representing a quarter cycle or an eighth of a cycle, down to a single sample. The processing power of the DSP and CPU is a limiting factor. In addition, the expense of the required hardware should be weighed against the increase in resolution.

| EXPLANATION OF SYMBOLS | |
|---|---|
| N | number of samples per cycle. |
| V | voltage channel. |
| I | current channel. |
| GAIN_I | optimal gain of current channel. |
| GAIN_V | optimal gain of voltage channel. |
| GAIN_VA | optimal gain of voltage channel Va. |
| GAIN_VB | optimal gain of voltage channel Vb. |
| GAIN_VC | optimal gain of voltage channel Vc. |
| GAIN_IA | optimal gain of current channel Ia. |
| GAIN_IB | optimal gain of current channel Ib. |
| GAIN_IC | optimal gain of current channel Ic. |

The following information is provided, for example, using lookup tables.

RMS_Scale[any gain]–user configurable scale of voltage or current based on a current transformer or potential transformer.

Power_Scale[V][I]=RMS_Scale[V]*RMS_Scale[I].

Calibration_Factor[ any gain]–factory configured calibration number for every gain channel.

Power_Calibration_Factor[ voltage gain] [current gain]=RMS_Calibration_Factor[voltage gain] *RMS_Calibration_Factor[current gain].

The DSP uses a one cycle calculation window which slides by one half cycle. The pre-processing of raw (unsealed and uncalibrated) data consists of, but is not limited to, the following calculations:

Per Channel:

Optimal gain, hereafter GAIN, is selected from all sampled gain channels, per the auto-ranging routine of the present invention.

Sum of all samples in a cycle for the selected optimal gain channels, hereafter RAW_SUM[GAIN].

Sum of all squared samples in a cycle for the selected optimal gain channels, hereafter RAW_SSQ[GAIN].

RMS value of all samples in a cycle for the selected optimal gain channels, hereafter RAW_RMS[GAIN].

Peak value of samples in a cycle for the selected optimal gain channels, hereafter RAW_PEAK[GAIN].

Per Phase of the Power System:

(Where voltage V and current I belong to the same phase of the power system).

Product of voltage RAW_SUM[GAIN_V] and current RAW_SUM[GAIN_I], hereafter RAW_VISUM [GAIN_V][GAIN_I];

Sum of products of voltage and current samples for a cycle, hereafter RAW_VIW [GAIN_V][GAIN_I];

$$RAW\_VIW[GAIN\_V][GAIN\_I] = \sum_{i=0}^{N} \{v_i * i_i\}$$

where:
  $v_i$—i-th sample in the optimal gain of voltage GAIN_V,
  $i_i$—i-th sample in the optimal gain of current GAIN_I.

Sum of products of voltage samples displaced by 90 degrees (with respect to current samples) and current samples for a cycle, hereafter RAW_VIV[GAIN_V][GAIN_I];

$$RAW\_VIV[GAIN\_V][GAIN\_I] = \sum_{i=0}^{N-N/4} \{v_{(i+N/4)} * i_i\} + \sum_{i=0}^{N/4} \{v_i * i_{(i+(N-N/4))}\}$$

where:
  $v_i$—i-th sample in the optimal gain of voltage GAIN_V,
  $i_i$—i-th sample in the optimal gain of current GAIN_I.

Sum of products of voltage samples displaced by 45 degrees (with respect to current samples) and current samples for a cycle, hereafter RAW_VIQ[GAIN_V][GAIN_I];

$$RAW\_VIQ[GAIN\_V][GAIN\_I] = \sum_{i=0}^{N-N/8} \{v_{(i+N/8)} * i_i\} + \sum_{i=0}^{N/8} \{v_i * i_{(i+(N-N/8))}\}$$

where:
  $v_i$—i-th sample in the optimal gain of voltage GAIN_V,
  $i_i$—i-th sample in the optimal gain of current GAIN_I.

Active power for a cycle using RAW_VIW[GAIN_V][GAIN_I] and RAW_VISUM[GAIN_V][GAIN_I], hereafter RAW_W[GAIN_V][GAIN_I], where RAW_W[GAIN_V][GAIN1I]=RAW_VIW[GAIN_V][GAIN_I]-RAW_VISUM[GAIN_V][GAIN_I].

Reactive power for a cycle using RAW_VIV[GAIN_V][GAIN_1] and RAW_VISUM[GAIN_V][GAIN_I], hereafter RAW_VAR[GAIN_V][GAIN_I], where RAW_VAR[GAIN_V][GAIN_I]=RAW_VIV[GAIN_V][GAIN_I]-RAW_VISUM[GAIN_V][GAIN_I].

Additional Calculations are Performed to Support Line to Line Voltage Calculations:

Sum of the products of phase voltage A samples and phase voltage B samples, hereafter RAW_VAB[GAIN_VA][GAIN_VB];

$$RAW\_VAB[GAIN\_VA][GAIN\_VB] = \sum_{i=0}^{N} \{va_i * vb_i\}$$

where:
  $va_i$—i-th sample in the optimal gain of voltage GAIN_VA,
  $vb_i$—i-th sample in the optimal gain of voltage GAIN_VB.

Sum of the product of phase voltage B samples and phase voltage C samples, hereafter RAW_VBC[GAIN_VB][GAIN_VC]; calculated using analogous mathematical operations for RAW_VAB described above.

Sum of the products of phase voltage C samples and phase voltage A samples, hereafter RAW_VCA[GAIN_VA][GAIN_VC]; calculated using analogous mathematical operations for RAW_VAB described above.

Using phase A voltage and phase B current, and the sum of the product of voltage and current samples for a cycle, hereafter RAW_VIW_AB[GAIN_VA][GAIN_IB];

$$RAW\_VIW\_AB[GAIN\_VA][GAIN\_IB] = \sum_{i=0}^{N} \{va_i * ib_i\}$$

where:
  $va_i$—i-th sample in the optimal gain of voltage GAIN_VA,
  $ib_i$—i-th sample in the optimal gain of current GAIN_IB.

Using phase A voltage and phase B current, and the sum of the products of voltage samples displaced by 90 degrees (with respect to current samples) and current samples for a cycle, hereafter RAW_VIV_AB[GAIN_VA][GAIN_IB];

$$RAW\_VIV\_AB[GAIN\_VA][GAIN\_IB] = \sum_{i=0}^{N-N/4} \{va_{(i+N/4)} * ib_i\} + \sum_{i=0}^{N/4} \{va_i * ib_{(i+(N-N/4))}\}$$

where:
  $va_i$—i-th sample in the optimal gain of voltage GAIN_VA,
  $ib_i$—i-th sample in the optimal gain of current GAIN_IB.

Using phase A voltage and phase B current, and the sum of the products of voltage samples displaced by 45 degrees (with respect to current samples) and current samples for a cycle, hereafter RAW_VIQ_AB[GAIN_VA][GAIN_IB];

$$RAW\_VIQ\_AB[GAIN\_VA][GAIN\_IB] = \sum_{i=0}^{N-N/8} \{va_{(i+N/8)} * ib_i\} + \sum_{i=0}^{N/8} \{va_i * ib_{(i+(N-N/8))}\}$$

where:
  $va_i$—i-th sample in the optimal gain of voltage GAIN_VA,
  $ib_i$—i-th sample in the optimal gain of current GAIN_IB.

Using phase C voltage and phase B current, and the sum of the products of voltage and current samples for a cycle, hereafter RAW_VIW_CB[GAIN_VC][GAIN_IB]; and performing analogous mathematical operations as for RAW_VIW_AB.

Using phase C voltage and phase B current, and the sum of the products of voltage samples displaced by 90 degrees (with respect to current samples) and current samples for a cycle, hereafter RAW_VIV_CB[GAIN_VC][GAIN_IB]; and performing analogous mathematical operations as for RAW_VIV_AB.

Using phase C voltage and phase B current, and the sum of the products of voltage samples displaced by 45 degrees (with respect to current samples) and current samples for a cycle, hereafter RAW_VIQ_CB[GAIN_VC][GAN_IB]; and performing analogous mathematical operations as for RAW_VIQ_AB.

Thereafter, the results of calculations described above are transferred to the CPU 22 via the DMA mechanism. The CPU 22 connects to the user interface 86 which allows users to program the monitor and retrieve revenue or power quality data, and generally interact with the meter. In the preferred embodiment, the user interface 86 includes a graphical display, and a keypad as well as LED indicators, and various data communications interfaces 87. The preferred method of capturing power quality data is to record a waveform which represents the input voltages and currents from the different phases of the electric circuit. In the preferred embodiment, the waveform is reconstructed by utilizing the sampling data, calibration data, scaling data and the gain selection information provided by the present gain control invention. Thus, the waveform recordings always contain signals recorded with optimal ADC counts and no portions of the signal are clipped or missing.

All gain channels are transferred into the six half cycle wide DMA sample buffers or a chain of buffers as a temporary storage area. The chain of the buffers are used in a circular fashion. When the gain selection data becomes available, two cycles after the samples arrive, the CPU 22 uses the gain selection data to locate the optimal data in the six half cycle DMA buffers and copy it to the user-configurable waveform recorder buffers. The waveform recorder buffers are under control of a Waveform Recording Module described in the commonly assigned co-pending patent application to Rene T. Jonker, et al. entitled "Revenue Meter with Power Quality Features." In the preferred embodiment, waveform recording is implemented using the ION Waveform Recording Module, manufactured by Power Measurement, Ltd., Saanichton, British Columbia, Canada. The low level waveform recorder firmware continuously transfers samples from the DSP 20 to the CPU 22 for all gain channels, even saturated gain channels.

Since different levels of gain channels can end up in the same waveform recorder buffer, the CPU 22 performs scaling required to reconstruct the recorded waveform. Every recorded sample is scaled and calibrated according to the gain channel from which it originated. Scaling and calibration data is stored for every gain channel in look-up tables, for example, which are set up during factory calibration procedures. The CPU 22 sorts and accumulates the pre-calculation numbers in buffers corresponding to the respective gain channels.

The CPU half-cycle task calibrates and scales the pre-calculation data, i.e., the half-cycle voltage and current RMS, active, reactive, and apparent power values, which are calculated on the DSP 20 and DMA-transferred to the CPU 22. The execution of the half-cycle task is synchronized to the input line frequency. The half cycle task performs, but is not limited to, the following calculations:

Per Channel:

One cycle of the RAW_RMS[GAIN] are scaled and calibrated to obtain HS_RMS. The GAIN is used to select appropriate scales and calibration numbers from look-up tables for example. The final one cycle results, i.e., HS_RMS, are loaded into the registers of the monitor 10 for presentation to the user and additional processing.

Accumulation of RAW_SUM[GAIN] into arrays indexed by channel GAIN for further processing as described below with regard to the one second task, hereafter ACC_RAW_SUM[GAIN].

Accumulation of RAW_SSQ[GAIN] into arrays indexed by channel GAIN for further processing as described below with regard to the one second task, hereafter ACC_RAW_SSQ[GAIN].

Counting number of updates per GAIN per second for further processing as described below with regard to the one second task, hereafter NC_UPDATES [GAIN].

Per Phase:

(Where voltage V and current I belong to the same phase of the power system).

One cycle RAW_W[GAIN V][GAIN_I], RAW_VAR [GAIN_V][GAIN_I] are scaled and calibrated to obtain active power HS_KW, and reactive power HS_KVAR, respectively. The GAIN V and GAIN I are used to select appropriate scales and calibration numbers from look-up tables. The final one cycle results, hereafter HS_KW, HS_KVAR are loaded into the registers of the monitor 10 for presentation to the user and further processing.

One cycle apparent power values are calculated using voltage HS_RMS and current HS_RMS. The final one cycle apparent power results, hereafter HS KVA, are loaded into the registers of the monitor 10 for presentation to the user and further processing, such as in the one second task described below.

RAW_VIW[GAIN_V][GAIN_I] is accumulated into arrays indexed by voltage channel GAIN and current channel GAIN for further processing, hereafter ACC_RAW_VIW[GAIN_V][GAIN_I].

RAW_VIV[GAIN_V] [GAIN_I] is accumulated into arrays indexed by voltage channel GAIN and current channel GAIN for further processing, hereafter ACC_RAW_VIV[GAIN_V][GAIN_I].

RAW_VIQ[GAIN_V][GAIN_1] is accumulated into arrays indexed by voltage channel GAIN and current channel GAIN for further processing, hereafter ACC_RAW_VIQ[GAIN_V][GAIN_I].

The number of accumulations are counted per phase per second, hereafter NP_UPDATES[GAIN_V] [GAIN_I], for processing as described below.

Additionally:

To calculate line to line voltage:

RAW_VAB values are scaled and calibrated using phase A voltage channel GAIN and phase B voltage channel GAIN to select appropriate scaling and calibration numbers. Using the known cosine theorem and RAW_SUM, RAW_SUM, RAW_SSQ, RAW_SSQ, line-to-line voltage between VA and VB, hereafter HS_VLLAB is calculated.

RAW_VBC[GAIN_VB][GAIN_VC]values are scaled and calibrated using phase B voltage channel GAIN and phase C voltage channel gain to select appropriate scaling and calibration numbers. Using the cosine theorem and RAW_SUM[GAIN_VB], RAW_SUM[GAIN_VC], RAW_SSQ[GAIN_VB], RAW_SSQ[GAIN_VC] line-to-line voltage between VB and VC, hereafter HS_VLLBC is calculated.

RAW_VCA[GAIN_VC][GAIN_VA] values are scaled and calibrated using phase A voltage channel GAIN and phase C voltage channel GAIN to select appropriate scaling and calibration numbers. Using the cosine theorem and RAW_SUM[GAIN_VA], RAW_SUM[GAIN_VC], RAW_SSQ[GAIN_VA], RAW_SSQ[GAIN_VC] line-to-line voltage between VC and VA, hereafter HS_VLLCA is calculated.

Accumulations are performed for a one second task accurate calculation of line to line voltage:

Accumulation of RAW_VAB[GAIN_VA][GAIN_VB] into arrays indexed by voltage A channel GAIN and voltage B channel GAIN for further processing. Counting the number of updates per pair of voltage channel GAINs, hereafter ACC_RAW_VAB[GAIN_VA][GAIN_VB].

Accumulation of RAW_VBC[GAIN_VB][GAIN_VC] into arrays indexed by voltage B channel GAIN and voltage C channel GAIN for further processing. The number of accumulations are counted per pair of voltage channel GAINs, hereafter ACC_RAW_VBC[GAIN_VB][GAIN_VC].

Accumulation of RAW_VCA[GAIN_VC][GAIN_VA] into arrays indexed by voltage C channel GAIN and voltage A channel GAIN for further processing. The number of accumulations are counted per pair of voltage channel GAINs, hereafter ACC_RAW_VCA[GAIN_VC][GAIN_VA].

For the Three Wire WYE Mode (36S):

Accumulation of RAW_VIW_AB[GAIN_VA][GAIN_IB] into arrays indexed by voltage channel GAIN and current channel GAIN for further processing. The number of accumulations are counted per pair of voltage channel GAIN and current channel GAIN, hereafter ACC_RAW_VIW_AB[GAIN_VA][GAIN_IB].

Accumulation of RAW_VIV_AB[GAIN_VA][GAIN_IB] into arrays indexed by voltage channel GAIN and current channel GAIN for further processing. The number of accumulation are counted per pair of voltage channel GAIN and current channel GAIN. Hereafter ACC_RAW_VIV_AB[GAIN_VA][GAIN_IB].

Accumulation of RAW_VIQ_AB[GAIN_VA][GAIN_IB] into arrays indexed by voltage channel GAIN and current channel GAIN for further processing. The number of accumulations are counted per pair of voltage channel GAIN and current channel GAIN, hereafter ACC_RAW_VIQ_AB[GAIN_VA][GAIN_IB].

Accumulation of RAW_VIW_CB[GAIN_VC][GAIN_IB] into arrays indexed by voltage channel GAIN and current channel GAIN for further processing. The number of accumulations are counted per pair of voltage channel GAIN and current channel GAIN, hereafter ACC_RAW_VIW_CB[GAIN_VC][GAIN_IB].

Accumulation of RAW_VIV_CB[GAIN_VC][GAIN_IB] into arrays indexed by voltage channel GAIN and current channel GAIN for further processing. The number of accumulations are counted per pair of voltage channel GAIN and current channel GAIN, hereafter ACC_RAW_VIV_CB[GAIN_VC][GAIN_IB].

Accumulation of RAW_VIQ_CB[GAIN_VC][GAIN_IB] into arrays indexed by voltage channel GAIN and current channel GAIN for further processing. The number of accumulations are counted per pair of voltage channel GAIN and current channel GAIN, hereafter ACC_RAW_VIQ_CB[GAIN_VC][GAIN_IB].

The number of accumulations are counted for the VA/IB pair and the VC/IB pair, hereafter respectively NPHAB_UPDATES[GAIN_VA][GAIN_IB], NPHCB_UPDATES[GAIN_VC][GAIN_IB].

The final one cycle line-to-line voltage results (HS_VLLAB, HS_VLLBC, HS_VLLCA) are loaded into registers of the monitor 10 for presentation to the user and further processing.

The total values of power factor, active, reactive and apparent power are calculated for a cycle. The final results are loaded into registers of the monitor 10 for presentation to the user and further processing.

The above calculated half cycle numbers are interfaced to various modules, e.g., with the waveform recorder module and harmonics module described in the commonly assigned co-pending patent application to Rene T. Jonker, et al. entitled "Revenue Meter with Power Quality Features."

The CPU 22 also performs a one second task that, as the name implies, preferably occurs every one second as set to the universal time. About once every second, the CPU one second task executes and reads the data from the CPU half-cycle task buffers. A double buffering scheme is used to provide tasks with mutually exclusive access to data. Thus, one second values are calculated for voltage and current RMS, active, reactive, apparent power, power factors, voltage and current unbalances, and line-to-line voltages, for example. It should be appreciated that the gain switching action may occur many times in one second. The one second values are calculated using samples and the pre-calculation results form the gain stages that were selected within this second. There is no hysteresis necessary around the switch points, and calculation results are accurate even if the signal level equals the switch point value, e.g., 156V RMS.

Once every second the accumulation arrays, described above for the half-cycle task, are passed to the one second calculation task. No restrictions are placed on the number of times the auto-ranging action of the present invention may occur within the one second period, the number of channels involved in auto-ranging at the same time and number of gain channels used. The monitor 10 may function in four Wire WYE Mode (or 9S Base Mode), three Wire WYE Mode (or 36S Base Mode), or DELTA Mode (or 35S Base Mode). The per channel and per phase calculations will be completed in full for the four Wire WYE Mode only. Other modes will use various sub-sets of the full calculation. Such changes should be obvious to those skilled in the art. The one second task performs, but is not limited to, the following calculations:

Per Channel:

Accurate one second root mean square value, hereafter RMS, are calculated, scaled and calibrated using:

ACC_RAW_SUM[GAIN],

ACC_RAW_SSQ[GAIN],

N-UPDATES[GAIN], and calibration and scaling values from the lookup table.

E.g. for Phase Current Channels:

$$Tmp1 = \sum_{GAIN=Creep}^{Overrange} \{NC\_UPDATES[GAIN]\}$$

$$Tmp2 = \sum_{GAIN=Creep}^{Overrange} \{RMS\_Scale[GAIN]^2 *$$

$$RMS\_Calibration\_Factor[GAIN]^2 *$$

$$\{ACC\_RAW\_SSQ[GAIN] - ACC\_RAW\_SUM[GAIN]^2 /$$

$$\{N * NC\_UPDATES[GAIN]\}\}\}$$

$$RMS\_I = \sqrt{Tmp2/Tmp1}$$

E.g. for Phase Voltage Channels:

$$Tmp1 = \sum_{GAIN=Nominal}^{Overrange} \{NC\_UPDATES[GAIN]\}$$

$$Tmp2 = \sum_{GAIN=Nominal}^{Overrange} \{RMS\_Scale[GAIN]^2 *$$

RMS_Calibration_Factor$[GAIN]^2$ *

$\{ACC\_RAW\_SSQ[GAIN] - ACC\_RAW\_SUM[GAIN]^2 /$ $\{N * NC\_UPDATES[GAIN]\}\}\}$ $$RMS\_V = \sqrt{Tmp2/Tmp1}$$

Final one second RMS values are loaded into the registers of the monitor 10 for presentation to the user and further processing, e.g., to provide set point action, data recording and data logging.

Per Phase:

Accurate active, reactive and apparent power, hereafter respectively KW, KVAR, KVA, are calculated scaled and calibrated using, ACC_RAW_SUM[GAIN_V],
ACC_RAW_SUM[GAIN_I],
ACC_RAW_VIW[GAIN_V][GAIN_I],
ACC_RAW_VIV[GAIN_V][GAIN_I],
NP_UPDATES[GAIN_V][GAIN_I], and
factory-set calibration tables and user-set scaling.

Active Power:

$$Tmp1 = \sum_{GAIN\_V=Nominal}^{Overrange} \left\{ \sum_{GAIN=Creep}^{Overrange} \{NP\_UPDATES[GAIN\_V][GAIN\_I]\} \right\}$$

$$Tmp2 = \sum_{GAIN\_V=Nominal}^{Overrange} \left\{ \sum_{GAIN=Creep}^{Overrange} \{Power\_Scale[GAIN\_V][GAIN\_I] * \right.$$

Power_Calibration_Factor[GAIN_V][GAIN_I] *

{ACC_RAW_VIW[GAIN_V][GAIN_I] –

ACC_RAW_SUM[GAIN_V] * ACC_RAW_SUM[GAIN_I] /

$\{N * NP\_UPDATE[GAIN\_V][GAIN\_I]\}\}\}\}$

KW={Tmp2/Tmp1}/1000.0

Reactive Power:

$$Tmp3 = \sum_{GAIN\_V=Nominal}^{Overrange} \left\{ \sum_{GAIN=Creep}^{Overrange} \{NP\_UPDATES[GAIN\_V][GAIN\_I]\} \right\}$$

$$Tmp2 = \sum_{GAIN\_V=Nominal}^{Overrange} \left\{ \sum_{GAIN=Creep}^{Overrange} \{Power\_Scale[GAIN\_V][GAIN\_I] * \right.$$

Power_Calibration_Factor[GAIN_V][GAIN_I] *

{ACC_RAW_VIV[GAIN_V][GAIN_I] –

ACC_RAW_SUM[GAIN_V] * ACC_RAW_SUM[GAIN_I] /

$\{N * NP\_UPDATE[GAIN\_V][GAIN\_I]\}\}\}\}$

Power_Scale[GAIN_V][$GAIN_{I]*Power}$_Calibration_Factor[GAIN_V][GAIN_I]* {ACC_RAW_VIV[GAIN_V][$GAIN_I$]–ACC_RAW_SUM[GAIN_V]*ACC_RAW_SUM[GAIN_I]/ {*NP_UPDATE[GAIN_V][GAIN_I]{{{{

KVAR={Tmp4/Tmp3}/1000.0

Apparent Power:

KVA=RMS_V*RMS_I/1000.0

Thereafter, accurate "quantity Q", hereafter KQ is calculated, scaled and calibrated using, ACC_RAW_SUM[GAIN_V],
ACC_RAW_SUM[GAIN_I],
ACC_RAW_VIQ[GAIN_V][GAIN_I],
NP_UPDATES[GAIN_V][GAIN_I], and
factory-set calibration tables and user-set scaling.

Quantity Q:

$$Tmp1 = \sum_{GAIN\_V=Nominal}^{Overrange} \left\{ \sum_{GAIN=Creep}^{Overrange} \{NP\_UPDATES[GAIN\_V][GAIN\_I]\} \right\}$$

$$Tmp2 = \sum_{GAIN\_V=Nominal}^{Overrange} \left\{ \sum_{GAIN=Creep}^{Overrange} \{Power\_Scale[GAIN\_V][GAIN\_I] * \right.$$

Power_Calibration_Factor[GAIN_V][GAIN_I] *

{ACC_RAW_VIQ[GAIN_V][GAIN_I] –

ACC_RAW_SUM[GAIN_V] * ACC_RAW_SUM[GAIN_I] /

$\{N * NP\_UPDATE[GAIN\_V][GAIN\_I]\}\}\}\}$

Power_Scale[GAIN_V][GAIN_I]*Power_Calibration_Factor[GAIN_V][GAIN_I]* {ACC_RAW_VIQ[GAIN_V][GAIN_I]–ACC_RAW_SUM[GAIN_V]* ACC_$RAW_{13}$ SUM[GAIN_I]/ {N*NP_UPDATE [$GAIN_{13}$ V][GAIN_I]{{{{

KQ={Tmp2/Tmp1}/1000.0

Thereafter, correction factors for KW and KVAR are calculated based on voltage channel GAIN and current channel GAIN. When necessary KW, KVAR, KQ values are corrected using the correction factors to remove effects of non-simultaneous sampling of voltage and current channels. The correction factors depend on the sampling sequence and time delays between acquisition of samples from different channels.

Values of KW, KVAR, KVA are evaluated against preset threshold levels to determine if further corrections are necessary due to voltage-to-current vector angles approaching+/−90 deg. If necessary KW and KVAR are corrected using KQ.

If KVAR==KVA
    KW=0.0
    Else If KW<<KVA
        KW=√2*(KQ)−KVR.
    If KW==KVA
    KW=0.0
    Else If KVAR<<KVA
        KVAR=√2*(KQ)−KW.

Additionally:

In three Wire WYE Mode (or 36S) mode, calculating RMS_VB voltage:

RMS_VB=√{RMS_$VA^2$+RMS_$VC^2$−RMS_VA*RMS_VC}.

To calculate line to line voltage for phase A and phase B: Accumulated ACC_RAW_VAB[GAIN_VA][GAIN_VB] values are scaled and calibrated using phase A voltage channel GAIN and phase B voltage channel GAIN to select appropriate scaling and calibration numbers, scaled and calibrated numbers are added from all used range pairs (of voltage A and voltage B). From vector relationships, angle, hereafter ANGLE_AB, is calculated between phase A voltage vector, hereafter VA and phase B voltage vector, hereafter VB. From the cosine theorem and using ANGLE_AB, ACC_RAW_SUM[GAIN_VA], ACC_RAW_SUM[GAIN_VB], ACC_RAW_SSQ[GAIN_VA], ACC_RAW_SSQ[GAIN_VB], line-to-line voltage are calculated between VA and VB, hereafter VLLAB.

Line-to-line voltage VLLAB:

NOTE: This calculation works if the same voltage gain is forced for all voltage channels. See the voltage auto-ranging flowchart (FIG. 5).

$$Tmp1 = \sum_{GAIN=Nominal}^{Overrange} \{NC\_UPDATES[GAIN]\}$$

For the Nominal range: GAIN_VA==GAIN_VB==NOMINAL

Angle between voltage vectors:

Tmp2=ACC_RAW_SSQ[GAIN_VA]*ACC_RAW_SSQ[GAIN_VB]

ANGLE_AB=arccos{ACC_RAW_VAB[GAIN_VA][GAIN_VB]/√Tmp2}

A correction CORR_ANGLE is calculated for ANGLE_AB to remove the phase shift between VA and VB introduced by sequential sampling. The sign of this correction depends on the sampling sequence and phase rotation. In a preferred embodiment, the voltage sampling sequence is: VA Nominal, VA Overrange, VB Nominal, VB Overrange, VC Nominal, VC Overrange. If phase rotation is ABC, correction is subtracted, if phase rotation is ACB, correction is added.

Line to Line Voltage is Calculated From the Cosine Theorem:

Tmp3=RMS_Calibration_Factor[GAIN_VA]$^2$*ACC_RAW_SSQ[GAIN_VA]+RMS_Calibration_Factor[GAIN_VB]$^2$*ACC_RAW_SSQ[

GAIN_VB]−2*RMS_Calibration_Factor[GAIN_VA]*RMS_Calibration_Factor[GAIN_VB]*ACC_RAW_VAB[GAIN_VA][GAIN_VB]*cos{ANGLE-AB±CORR_ANGLE}

Tmp4=RMS_Calibration_Factor[GAIN_VA]*ACC_RAW_SUM[GAIN_VA]/NC_UPDATES[GAIN_VA]−RMS_Calibration_Factor[GAIN_VB]*ACC_RAW_SUM[GAIN_VB]/NC_UPDATES[GAIN_VB]

Tmp5=RMS_Scale[GAIN_VA]$^2${Tmp3−{Tmp4}$^2$/N}

For Overrange Range: GAIN_VA==GAIN_VB==OVERRANGE

Angle Between Voltage Vectors:

Tmp6=ACC_RAW_SSQ[GAIN_VA]*ACC_RAW_SSQ[GAIN_VB]

ANGLE_AB=arccos{ACC_RAW_VAB[GAIN_VA][GAIN_VB]/√Tmp6}

A correction CORR_ANGLE is calculated for ANGLE_AB to remove the phase shift between VA and VB introduced by sequential sampling. The sign of this correction depends on the sampling sequence and phase rotation. In a preferred embodiment, the voltage sampling sequence is: VA Nominal, VA Overrange, VB Nominal, VB Overrange, VC Nominal, VC Overrange. If phase rotation is ABC, correction is subtracted, if phase rotation is ACB, correction is added.

Line to Line Voltage From the Cosine Theorem:

Tmp7=RMS_Calibration_Factor[GAIN_VA]$^2$*ACC_RAW_SSQ[GAIN_VA]+RMS_Calibration_Factor[GAIN_VB]$^2$*ACC_RAW_SSQ[GAIN_VB]−2*RMS_Calibration_Factor[

GAIN_VA]*RMS_Calibration_Factor[GAIN_VB]*ACC_RAW_VAB[GAIN_VA][GAIN_VB]*cos{ANGLE_AB±CORR_ANGLE}

Tmp8=RMS_Calibration_Factor[GAIN_VA]*ACC_RAW_SUM[GAIN_VA]/NC_UPDATES[GAIN_VA]−RMS_Calibration_Factor[GAIN_VB]*ACC_RAW_SUM[GAIN_VB]/NC_UPDATES[GAIN_VB]

Tmp9=RMS_Scale[GAIN_VA]$^2$*{Tmp7−{Tmp8}$^2$/N}VLLAB=√{Tmp5+Tmp9}/Tmp1

Thereafter, to Calculate the Line to Line Voltage for Phase B and Phase C:

Accumulated ACC_RAW_VBC[GAIN_VB][GAIN_VC] values are scaled and calibrated using phase B voltage channel GAIN and phase C voltage channel GAIN to select appropriate scaling and calibration numbers. Scaled and calibrated numbers are added from all used range pairs (of voltage B and voltage C). From vector relationships, an angle, hereafter ANGLE_BC, is calculated between the phase B voltage vector and the phase C voltage vector, hereafter VC. From the cosine theorem and using ANGLE_BC, ACC_RAW_SUM[GAIN_VB], ACC_RAW_SUM[GAIN_VC], ACC_RAW_SSQ[GAIN_VB], ACC_RAW_SSQ[GAIN_VC], line-to-line voltage are calculated between VB and VC, hereafter VLLBC. Analogous mathematical operations are performed as for VLLAB.

Thereafter, to calculate the line to line voltage for phase C and phase A:

Accumulated ACC_RAW_VCA[GAIN_VA][GAIN_VC] values are scaled and calibrated using phase A voltage channel GAIN and phase C voltage channel GAIN to select appropriate scaling and calibration numbers. Scaled and calibrated numbers are added from all used range pairs (of voltage C and voltage A ). From the vector relationships, angle, hereafter ANGLE_CA, is calculated between phase A voltage vector and phase C voltage vector. Using the cosine theorem and ANGLE_CA, ACC_RAW_SUM[GAIN_VC], ACC_RAW_SUM[GAIN_VC], ACC_RAW_SSQ[GAIN_VA], ACC_RAW_SSQ[GAIN_VA], line-to-line voltage is calculated between VC and VA, hereafter VLLBC. Analogous mathematical operations are performed as for VLLAB. Correction of ANGLE_CA is accomplished with an opposite sign with respect to the correction used for the correction of ANGLE_AB and ANGLE_BC.

The final one second line-to-line voltage results and calculation results are loaded into the registers of the monitor 10 for presentation to the user and further processing.

For Three Wire WYE Mode (36S):

For voltage VA and current IB, scaling and calibrating of accurate active, reactive and apparent power are calculated, hereafter respectively KW_AB, KVAR_AB, KVA_AB, KQ_AB, wherein,

ACC_RAW_SUM[GAIN_VA].

ACC_RAW_SUM[GAIN_IB].
ACC_RAW_VIW[GAIN_VA][GAIN_IB].
ACC_RAW_VIV[GAIN_VA][GAIN_IB].
ACC_RAW_VIQ[GAIN_VA][GAIN_IB].
NP_UPDATES[GAIN_VA][GAIN_IB].

For voltage VC with current IB, calculating, scaling and calibrating of accurate active, reactive and apparent power is performed, hereafter respectively KW_CB, KVAR_CB, KVA_CB, KQ_CB, using, ACC_RAW_SUM[GAIN_VC].
ACC_RAW_SUM[GAIN_IB].
ACC_RAW_VIW[GAIN_VC][GAIN_IB].
ACC_RAW_VIV[GAIN_VC][GAIN_IB].
ACC_RAW_VIQ[GAIN_VC][GAIN_IB].
NP_UPDATES[GAIN_VC][GAIN_IB].

For VA/IB:
GAIN_V=GAIN_VA, GAIN_I=GAIN_IB
For VC/IB:
GAIN_V=GAIN_VC, GAIN_I=GAIN_IB

Active Power:

$$Tmp1 = \sum_{GAIN\_V=Nominal}^{Overrange} \left\{ \sum_{GAIN\_I=Creep}^{Overrange} \{NP\_UPDATES[GAIN\_V][GAIN\_I]\} \right\}$$

$$Tmp2 = \sum_{GAIN\_V=Nominal}^{Overrange} \left\{ \sum_{GAIN\_I=Creep}^{Overrange} \{Power\_Scale[GAIN\_V][GAIN\_I] * \right.$$

Power_Calibration_Factor[GAIN_V][GAIN_I] *

{ACC_RAW_VIW[GAIN_V][GAIN_I] −

ACC_RAW_SUM[GAIN_V] * ACC_RAW_SUM[GAIN_I] /

{N * NP_UPDATE[GAIN_V][GAIN_I]}}}}

Power_Scale[GAIN_V][GAIN_I]* Power_Calibration_Factor[GAIN_V][GAIN_I]* {ACC_RAW_VIW[GAIN_V][GAIN_I]−ACC_RAW_SUM_[GAIN$_{13}$ V]* ACC_RAW_SUM[GAIN_I]/ {* NP_UPDATE [GAIN_V][GAIN_I]{{{{

KW={Tmp2/Tmp1}/1000.0

Reactive Power:

$$Tmp3 = \sum_{GAIN\_V=Nominal}^{Overrange} \left\{ \sum_{GAIN\_I=Creep}^{Overrange} \{NP\_UPDATES[GAIN\_V][GAIN\_I]\} \right\}$$

$$Tmp2 = \sum_{GAIN\_V=Nominal}^{Overrange} \left\{ \sum_{GAIN\_I=Creep}^{Overrange} \{Power\_Scale[GAIN\_V][GAIN\_I] * \right.$$

Power_Calibration_Factor[GAIN_V][GAIN_I] *

{ACC_RAW_VIV[GAIN_V][GAIN_I] −

ACC_RAW_SUM[GAIN_V] * ACC_RAW_SUM[GAIN_I] /

{N * NP_UPDATE[GAIN_V][GAIN_I]}}}}

Power_Scale[GAIN_V][GAIN_I]* Power_Calibration_Factor[GAIN_V][GAIN_I]* {ACC_RAW_VIV[GAIN_V][GAIN_I]−ACC_RAW_SUM_[GAIN$_{13}$ V]* ACC_RAW_SUM[GAIN_I]/ {* NP_UPDATE [GAIN_V][GAIN_I]{{{{

KVAR={Tmp4/Tmp3/1000.0

Apparent Power:

KVA=RMS[GAIN_V]*RMS[GAIN_I]/1000.0

Quantity Q:

$$Tmp1 = \sum_{GAIN\_V=Nominal}^{Overrange} \left\{ \sum_{GAIN\_I=Creep}^{Overrange} \{NP\_UPDATES[GAIN\_V][GAIN\_I]\} \right\}$$

$$Tmp2 = \sum_{GAIN\_V=Nominal}^{Overrange} \left\{ \sum_{GAIN\_I=Creep}^{Overrange} \{Power\_Scale[GAIN\_VI[GAIN\_I] * \right.$$

Power_Calibration_Factor[GAIN_V][GAIN_I] *

{ACC_RAW_VIQ[GAIN_VI(GAIN_I] −

ACC_RAW_SUM[GAIN_V] * ACC_RAW_SUM[GAIN_I] /

{N * NP_UPDATE[GAIN_V][GAIN_I]}}}}

Power_Scale[GAIN_VI[GAIN_I]* Power_Calibration_Factor[GAIN_V][GAIN_I]* {ACC_RAW_VIQ[GAIN_VI(GAIN_I]−ACC_RAW_SUM[GAIN$_{13}$ V]* ACC_RAW_SUM[GAIN_I]/ {* NP_UPDATE [GAIN_V][GAIN_I]{{{{

KQ={Tmp2/Tmp1}/1000.0

Thereafter, values KW_AB, KVAR_AB, KVA_AB and KW_CB, KVAR_CB, KVA_CB are evaluated against preset threshold levels to determine if further corrections are necessary due to voltage-to-current vector angles approaching +/−90 deg. If necessary, KW and KVAR are corrected using KQ.

If KVAR==KVA
   KW=0.0,
Else If KW<<KVA
p2 KW=√2*(KQ)−KVR.
If KW==KVA
p2 KVAR=0.0
Else If KVAR<<KVA
   KVAR=√2*(KQ)−KW.

Thereafter, total values of active, reactive and apparent power arc calculated:

In 4 WIRE WYE (or 9S) Mode:
Total active power=KW_A+KW_B+KW_C
Total reactive power=KVAR_A+KVAR_B+KVAR_C
Total apparent power=√{Total active power$^2$+Total reactive power 2}

In 3 WIRE WYE (or 36S) Mode:
Total active power=KW_A+KW_C − (KW-AB+KW_CB)
Total reactive power=KVAR_A+KVAR_C−(KVAR_AB+KVAR_CB)
Total apparent power=√{Total active power$^2$+Total reactive power$^2$}

In DELTA (or 35S) Mode:
Total active power=KW_A+KW_C
Total reactive power=KVAR_A+KVAR_C
Total apparent power=√{total active power$^2$+Total reactive power$^2$}

The automatically controlled gain switching of the present invention is used, for example, with revenue meters further described in commonly assigned co-pending patent application to Rene T. Jonker, et al. entitled "Revenue Meter with Power Quality Features." ANSI standards define two general types of revenue meters, socket based ("S-base" or "Type S") and bottom connected ("A-base" or "Type A"). A third type of revenue meter, known as a "Switchboard Meter" or "Draw-out Meter", is also commonly in use in the industry. These types of revenue meters are distinguished, in at least one respect, by the method in which they are connected to the electric circuit that they are monitoring. All three meter types are designed for connection to the three phase electric power system.

Figure 7:
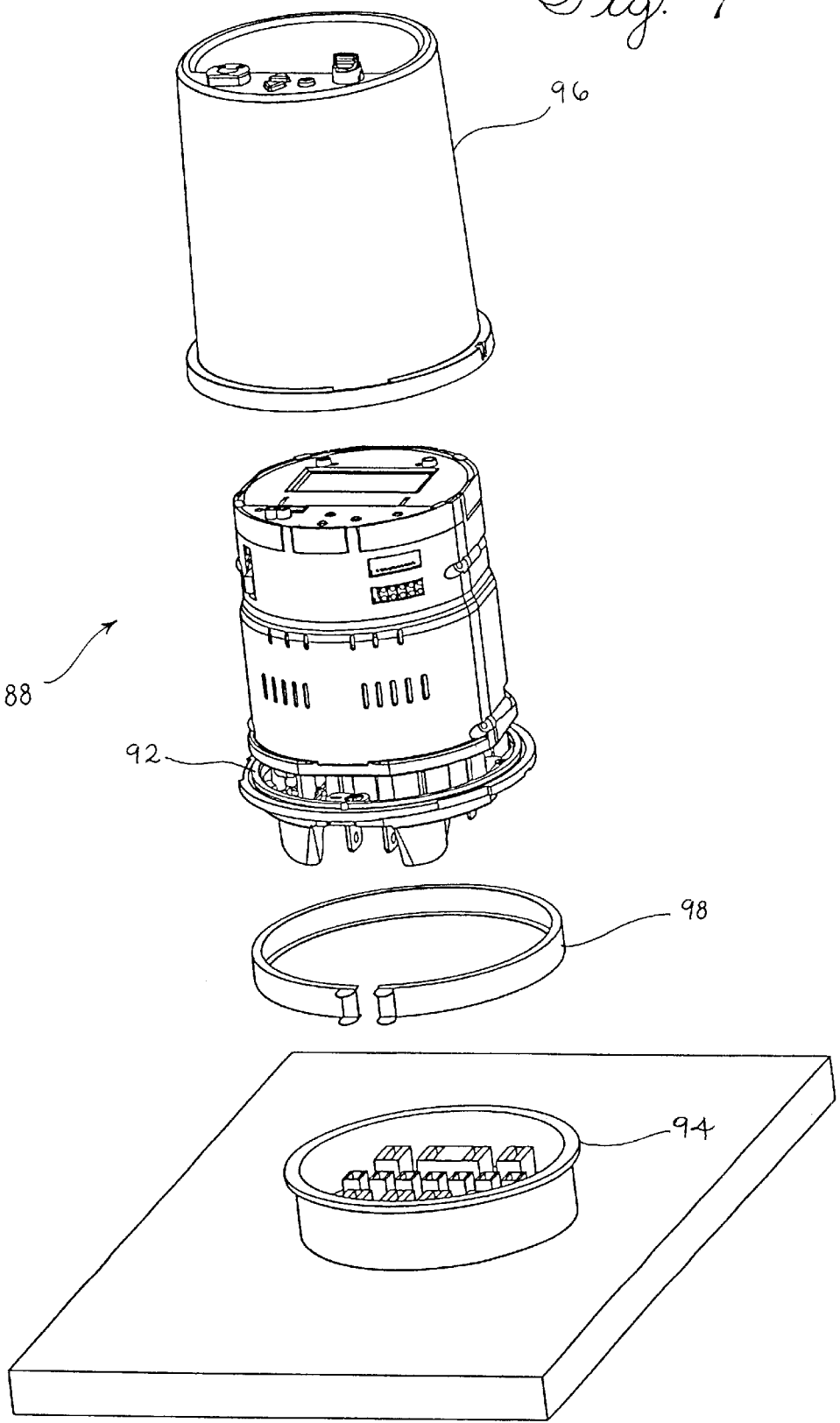
FIG. 7 depicts a perspective view of an exemplary S-Base revenue meter and socket type detachable meter mounting device for connecting the meter to an electrical circuit, for use with the present automatic gain control algorithm.
Figure 8:
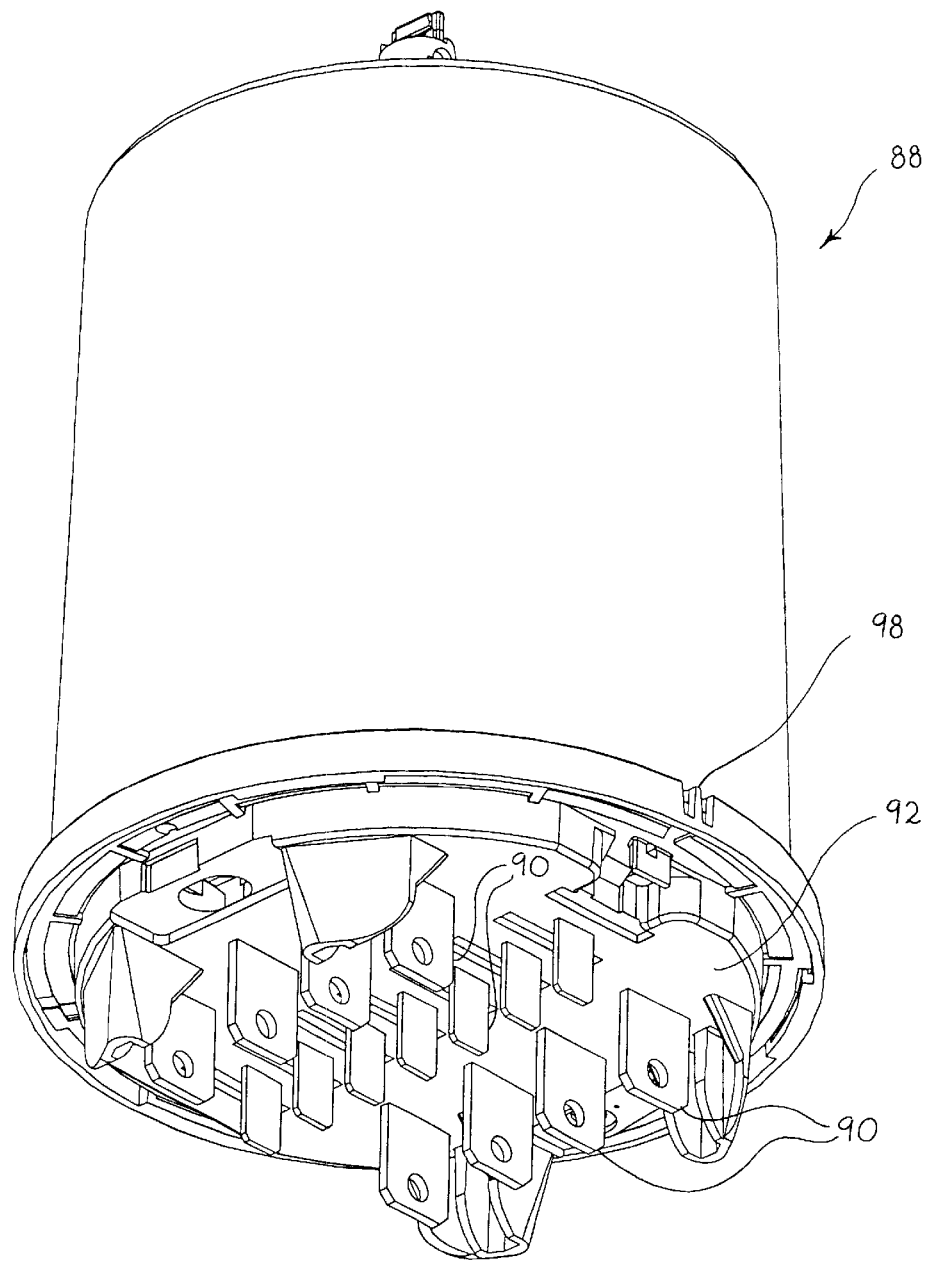
FIG. 8 shows the blade type terminals on the back of the revenue meter depicted in FIG. 7.

Referring now to FIGS. 7 though 9, an S-base revenue meter is shown, indicated generally as 88. An exemplary S-base revenue meter is the 8500 ION Revenue Meter manufactured by Power Measurement Limited, Saanichton, British Columbia, Canada. S-base meters feature blade type terminals 90 disposed on back side of the meter 92. These blade terminals are designed to mate with matching jaws of a detachable meter mounting device such as a revenue meter socket 94. The socket is hard wired to the electrical circuit 14 and is not meant to be removed. An exemplary meter socket is the 3000 Series manufacture by Meter Devices Co., Inc., Canton, Ohio. S-base meters also have a cover 96 which encloses the meter electronics and display. The cover 96 has a sealing mechanism 98 which prevents unauthorized access to the meter electronics. To install an S-base meter, the utility plugs the meter into the socket. This makes installation of new meters and especially replacement of a defective meters extremely simple. Once installed, the installer need only secure the sealing means which ensure that the meter will not be tampered with (as detailed in the ANSI standards). Exemplary sealing means are the Screw Type Sealing Ring, Model 10-9090 manufactured by Ekstrom Industries, Inc., Farmington Hills, Mich. To remove or replace the meter, the installer need only remove the sealing means and pull the meter out of the socket.

Figure 10:
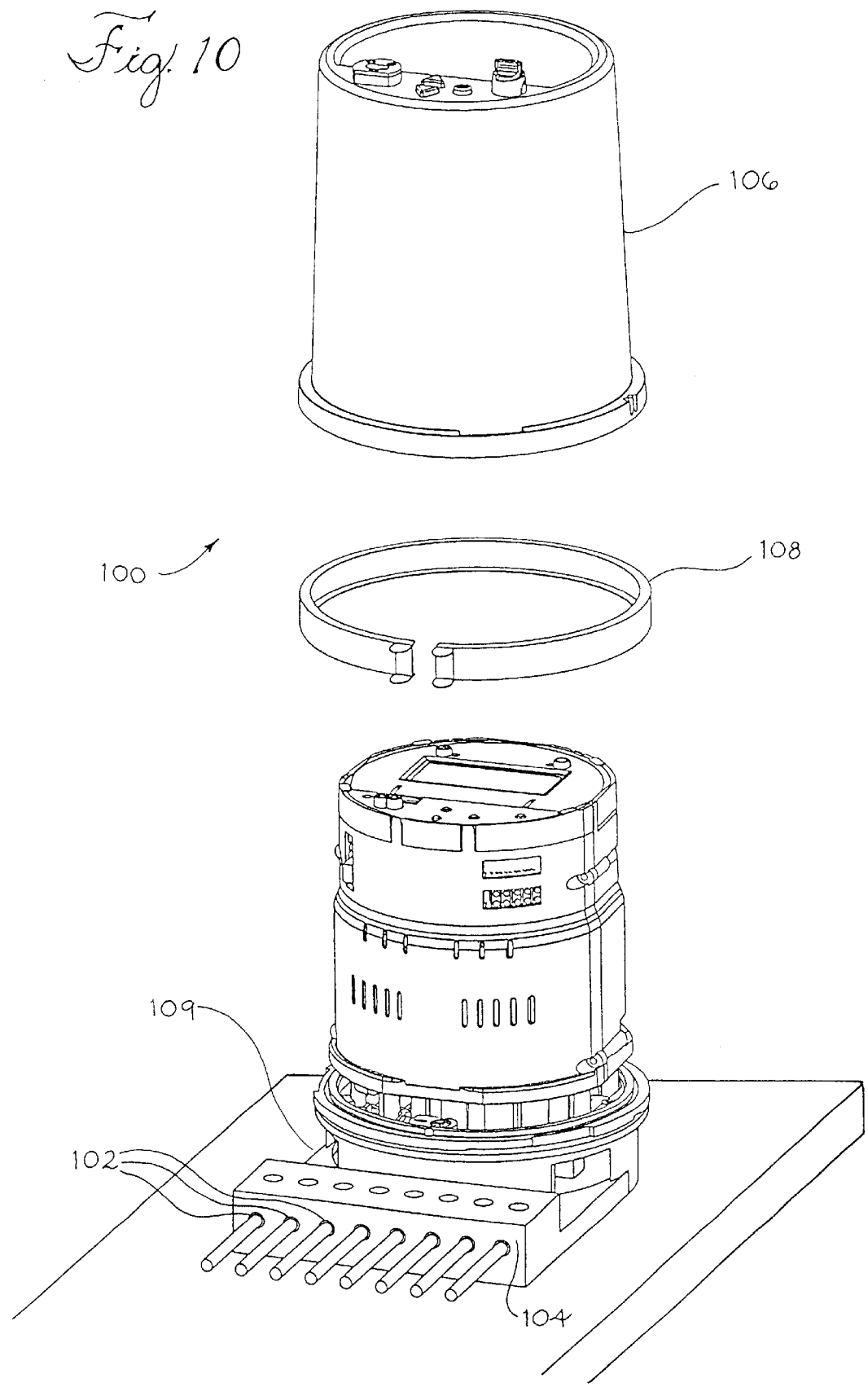
FIG. 10 depicts a perspective view of an exemplary A-Base revenue meter with bottom connected terminals for connecting the meter to an electrical circuit, for use with the present automatic gain control algorithm.

Referring now to FIG. 10, an A-base revenue meter, indicated generally as 100, is shown. A-base meters 100 feature bottom connected terminals 102 on the bottom side of the meter 104. These terminals 102 are typically screw terminals for receiving the conductors of the electric circuit 14. A-base meters 100 are directly connected to the electric circuit 14 and can only be installed or removed by connecting or disconnecting the conductors of the electric circuit 14. Typically, this means tightening or loosening each terminal 102 to secure or free the end of the conductor. A-base meters 100 have a cover 106 which encloses the meter electronics and the display. The cover 106 has a sealing mechanism 108 which prevents unauthorized tampering with the meter electronics. Typically, A-base meters 100 also have a second cover and sealing mechanism (neither shown) which encloses the terminal connections. This cover and sealing mechanism prevents unauthorized removal of the A-base meter 100. It is also known in the art to provide a single sealing mechanism which seals both the meter cover and the terminal cover. For the purposes of this disclosure, A-base meters 100 also include S-base meters 88 in combination with A-base adapters 109. An exemplary A-base adapter is the Polyphase Transformer Rated A to S Adapter manufactured by Ekstrom Industries, Incorporated, Farmington Hills, Mich.

Figure 11:
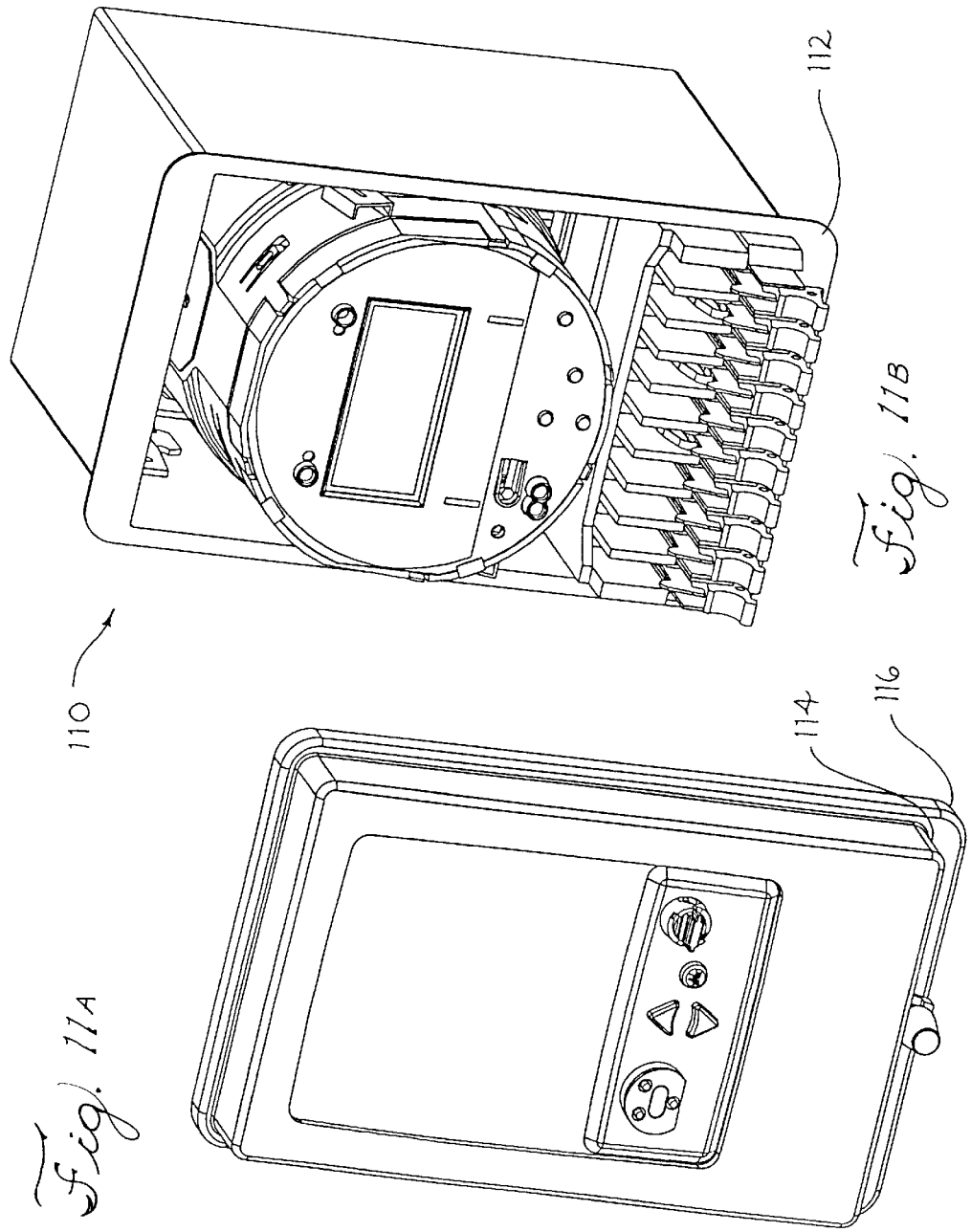
FIGS. 11(a) and 11(b) depicts a perspective view of an exemplary switchboard revenue meter and meter cover, for use with the present automatic gain control algorithm.
Figure 12:
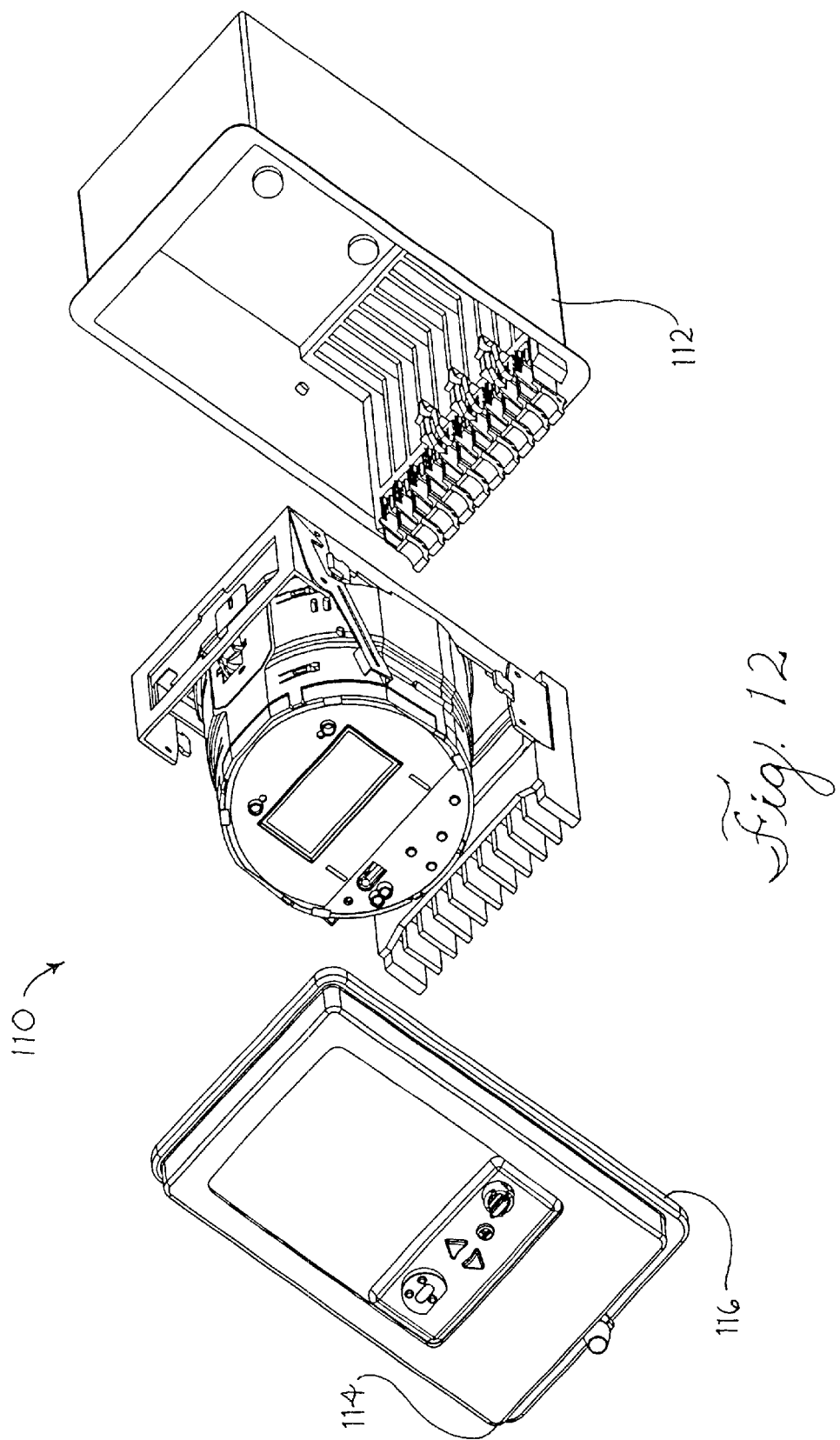
FIG. 12 depicts a perspective view of the exemplary switchboard revenue meter of FIG. 11, with the draw-out chassis, which holds the meter electronics, removed.

Referring now to FIGS. 11 and 12, there is shown a Switchboard Meter, indicated generally as 110. The Switchboard meter 110 consists of a switchboard enclosure 112 which is physically mounted and connected to the electrical distribution system. Exemplary enclosures are the ABB FT-21 and ABB-FT-32 manufactured by ABB Electricity Metering, Raleigh, N.C. The revenue meter, which includes the meter electronics and display, is mounted on a draw-out chassis which is removable from the switchboard enclosure. The draw-out chassis interconnects the meter electronics with the electrical circuit 14. The draw-out chassis contains electrical connections (not shown) on the top and bottom which mate with matching electrical connectors inside the enclosure when the chassis is slid into place. The enclosure 112 also has a cover 114 which completely seals the meter inside the enclosure. The cover 114 has a sealing mechanism which prevents removal of the cover and indicates when the cover has been tampered.

Figure 9B:
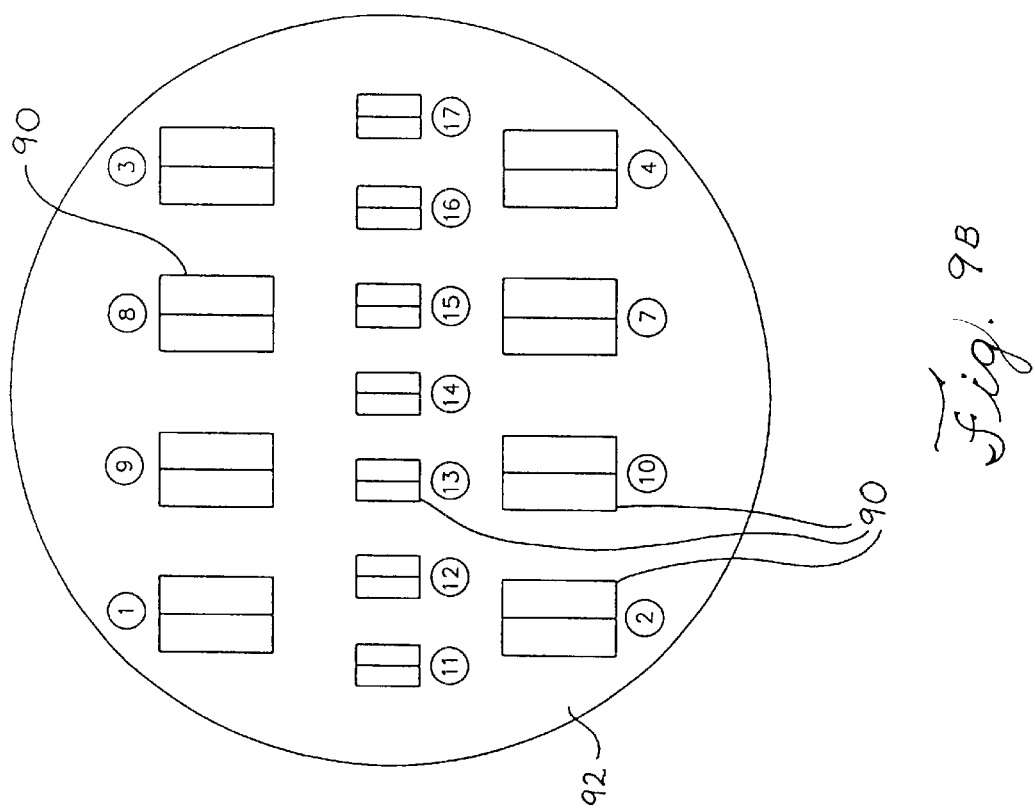
FIGS. 9(a) and 9(b) shows exemplary layouts of the matching jaws of the detachable meter mounting device of FIG. 7 for receiving the blade type terminals shown in FIG. 8.
Figure 9A:
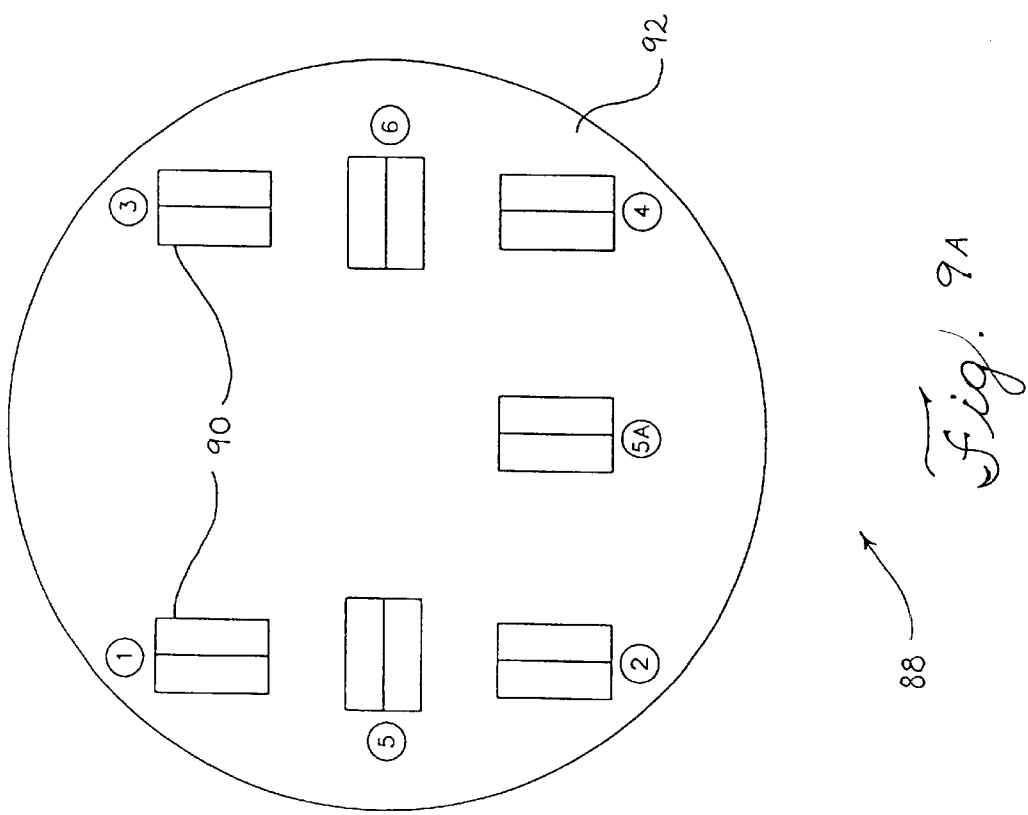

Relevant ANSI standards specify the exact physical and electrical requirements of the blade terminals 90 for the S-base meters 88 (See FIG. 9) and the bottom connected terminals 102 for the A-base meters 100. Further, these standards also specify revenue metering requirements common to both S-base and A-base meters 88 and 100 as well as Switchboard meters 110. These standards include accuracy, durability and operating lifetime requirements. They further include requirements for physically sealing the meters to prevent unauthorized tampering.

Revenue meters must comply with American National Standards Institute's ("ANSI") Standards for electric meters which include, but are not limited to, the following:

ANSI C12.1 (1995): American National Standard for Electric Meters-Code for Electricity Metering ANSI C12.10 (1987): American National Standard for Electromechanical Watthour Meters ANSI C12.13 (1991): American National Standard for Electronic Time of Use Registers for Electricity Meters ANSI C12.16 (1991): American National Standard for Solid-State Electricity Meters ANSI C12.20 (1998): American National Standard for Electricity Meters 0.2 and 0.5 Accuracy Classes.

All of the above listed standards are known in the art and are herein incorporated by reference.

Other specification/standards which apply to revenue meters include ISO Specification MTR1-96, "Engineering Specification for Polyphase Solid State Electricity Meters for Use on the ISO Grid," herein incorporated by reference.

Referring again to FIGS. 1 through 6, revenue meters must provide sealing mechanisms to both protect the meter from environmental conditions existing in the installed location as well as protect the meter from unauthorized tampering. Typically, A-base and S-base revenue meters are contained entirely within a housing which features a meter cover usually made of a transparent material. Typically, the enclosed components include the meter electronics, voltage sense circuits, current sense circuits, the meter display and the user interface as specified by the ANSI standards. In typical applications, CTRs and PTRs are located remote from the revenue meter and connected with the meter's internal voltage and current sensors via the S-base or A-base connection in order to isolate dangerous high voltage signals from the meter. In the exemplary 8500 ION Revenue Meter, an auxiliary set of CTR's is provided inside the meter to provide isolation. Potential (or Voltage) isolation in the exemplary 8500 ION Revenue Meter is accomplished with a network of resistors and op-amps. Further, it is well known in the art to provide revenue meters with external interface mechanisms such as telephony and network connections in order to enhance the meter's capabilities.

Switchboard meters are typically contained within a switchboard enclosure. The switchboard enclosure usually features a cover with a transparent face to allow the meter display to be read and the user interface to be interacted with by the user. The cover also has a sealing mechanism to prevent unauthorized access similar to the S-base and A-base meters.

The transparent meter cover permits the viewing of the meter display without having to remove the meter cover. Further, the meter cover may also provide mechanisms for interacting with the meter with the meter cover in place. Such mechanisms include scroll buttons, reset switches or other input devices, and optical couplers, infrared emitters or other output devices. All of these mechanisms are able to function with the meter cover in place as specified in the ANSI standards. The meter cover can be held in place by a separate sealing mechanism which locks the cover to the meter and indicates when there has been unauthorized tampering with the cover. Typically, however, the sealing mechanism also serves to lock the meter to the electrical circuit connection.

As shown in FIG. 7, in the case of the S-base meter 88, the sealing mechanism 98 also seals the meter to the meter socket 94. Removal of the meter necessitates disengaging the sealing mechanism 98, which would indicate unauthorized tampering. As shown in FIG. 10, in the case of the A-base meter 100, the sealing mechanism also seals a separate (possibly joined) terminal cover 106 which prevents disconnection of the conductors from the terminals without disengaging the sealing mechanism. It should be understood that separate sealing mechanisms can be provided to seal the meter cover and seal the meter to the electrical connection and that other methods of tamper detection and environmental protection are well known in the art.

From the foregoing description, it should be understood that an improved monitor and method for gain switching has been shown and described which has many desirable attributes and advantages. The improved monitor operates within a wide range of input voltage and current. Further, by using sliding window calculations, the firmware controlled gain switching allows the monitor to achieve an improved resolution accuracy and waveform recording quality compared to other monitors. In addition, the present invention guarantees no missing or clipped samples in the waveform recordings within the operating input range of the device.

It is to be understood that changes and modifications to the embodiments described above will be apparent to those skilled in the art, and are contemplated. It is therefore intended that the foregoing detailed description be regarded as illustrative rather than limiting, and that it be understood that it is the following claims, including all equivalents, that are intended to define the spirit and scope of this invention.

What is claimed is:

1. A monitor for measuring or controlling power gain switching of a monitor, the monitor comprising:
   one or more sensors coupled with the electric circuit and operative to sense one or more power parameters in the electric circuit and generate one or more analog signals indicative of said power parameters;
   at least one analog to digital converter coupled with said sensors and operative to convert said analog signals to one or more digital samples; and
   at least one processor coupled with said analog to digital converter and operative to automatically select a gain channel defined by a predetermined electrical range from a plurality of gain channels based on samples of said gain channel having a bit count near a maximum bit count for said gain channel, without saturating said gain channel, said gain channel representing an input channel to be monitored;
   said at least one analog to digital converter sampling said plurality of gain channels simultaneously;
   wherein said processor uses samples from more than one of said plurality of gain channels to calculate power parameters.

2. The monitor according to claim 1 wherein said input channel is a voltage input channel.

3. The monitor according to claim 2 wherein said voltage input channel is split and amplified into at least two voltage gain channels.

4. The monitor according to claim 3 wherein said voltage gain channels comprise a nominal gain channel and an overrange gain channel.

5. The monitor according to claim 4 wherein said nominal gain channel includes a voltage range of about 0 to 156 V RMS.

6. The monitor according to claim 4 wherein said overrange gain channel includes a voltage range of about 0 to 1000 V RMS.

7. The monitor according to claim 1 wherein said input channel is a current input channel.

8. The monitor according to claim 7 wherein said current input channel is split and amplified into at least two current gain channels.

9. The monitor according to claim 8 wherein said current gain channels comprise a creep gain channel, an underrange gain channel, a nominal gain channel and an overrange gain channel.

10. The monitor according to claim 9 wherein said creep gain channel includes a current range of about 0 to 0.8 A RMS.

11. The monitor according to claim 9 wherein said underrange gain channel includes a current range of about 0 to 3.2 A RMS.

12. The monitor according to claim 9 wherein said nominal gain channel includes a current range of about 0 to 12.5 A RMS.

13. The monitor according to claim 9 wherein said overrange gain channel includes a current range of about 0 to 50 A RMS.

14. The monitor according to claim 1, further comprising:
   bayonet terminals disposed on the monitor mateable with matching jaws of a detachable meter mounting device; and
   a seal connected between said monitor and said detachable meter mounting device, said seal operative to prevent removal of the monitor and indicate tampering with the monitor.

15. The monitor according to claim 1 wherein said analog to digital converter converts said analog signals to said one or more digital samples at a rate of at least 16 samples per cycle.

16. The monitor according to claim 1 wherein said processor comprises a digital signal processor.

17. The monitor according to claim 1, further comprising:
   a display;
   terminals disposed on a bottom side of the monitor for coupling the monitor with said electric circuit;
   a meter cover operative to enclose the monitor and said display;
   a terminal cover for covering said terminals;
   a first seal connected with said meter cover and operative to prevent removal of said meter cover; and
   a second seal connected with said terminal cover and operative to prevent removal of said terminal cover.

18. The monitor according to claim 1, further comprising:

a draw-out chassis coupled with the monitor and operative to fit within a switchboard enclosure;

terminals disposed on said chassis for engaging matching terminals within said enclosure;

a display;

a meter cover operative to enclose the monitor and said display within said enclosure; and a seal connected with said meter cover and operative to prevent removal of said meter cover and indicate tampering with the monitor.

19. The monitor according to claim 1 wherein said at least one processor uses all of said plurality of gain channels to calculate power parameters.

20. A method for automatically controlling gain switching of a monitor based on an input waveform, the method comprising the steps of:

splitting an input channel into a plurality of gain channels;

simultaneously sampling said plurality of gain channels;

accessing a present buffer of a first gain channel, said present buffer containing a predetermined amount of samples which represent said input channel;

determining whether at least one of said samples contained in said present buffer is saturated;

if at least one of said samples is saturated, selecting an alternate gain channel;

else, if none of said samples are saturated, determining whether a previous buffer of said first gain channel is saturated;

if none of said samples from said previous buffer are saturated, selecting said first gain channel; and else, selecting said alternate gain channel;

processing said samples from more than one of said plurality of gain channels to calculate power parameters.

21. The method according to claim 20 wherein said input channel is a voltage input channel.

22. The method according to claim 21 wherein said step of splitting divides said voltage input channel into at least two voltage gain channels.

23. The method according to claim 22 wherein said voltage gain channels comprise a nominal gain channel and an overrange gain channel.

24. The method according to claim 23 wherein said nominal gain channel includes a voltage range of about 0 to 156 V RMS.

25. The method according to claim 23 wherein said overrange gain channel includes a voltage range of about 0 to 1000 V RMS.

26. The method according to claim 20 wherein said input channel is a current input channel.

27. The method according to claim 26 wherein said step of splitting divides said current input channel into at least two current gain channels.

28. The method according to claim 27 wherein said current gain channels comprise a creep gain channel, an underrange gain channel, a nominal gain channel and an overrange gain channel.

29. The method according to claim 28 wherein said creep gain channel includes a current range of about 0 to 0.8 A RMS.

30. The method according to claim 28 wherein said underrange gain channel includes a current range of about 0 to 3.2 A RMS.

31. The method according to claim 28 wherein said nominal gain channel includes a current range of about 0 to 12.5 A RMS.

32. The method according to claim 28 wherein said overrange gain channel includes a current range of about 0 to 50 A RMS.

33. The method according to claim 20 wherein said determination step of whether said previous buffer of said first gain channel is saturated includes examining whether a previous-gain-stage indicator indicates said first gain channel.

34. The method according to claim 33, wherein said previous buffer of said first gain channel is not saturated if said previous-gain-stage indicator indicates said first gain channel.

35. The method according to claim 20 wherein said present buffer and said previous buffer correspond to a predetermined amount of samples of the input waveform.

36. The method according to claim 35 wherein said predetermined amount of samples comprises one-half cycle of the input waveform.

37. The method according to claim 20, further including the step of performing at least one calculation utilizing said samples in all of said gain channels.

38. The method according to claim 37 wherein said calculation step includes calculating at least one of a root mean square, an active, a reactive and an apparent power.

* * * * *

UNITED STATES PATENT AND TRADEMARK OFFICE
CERTIFICATE OF CORRECTION

PATENT NO.    : 6,397,155 B1
DATED         : May 28, 2002
INVENTOR(S)   : Piotr B. Przydatek et al.

It is certified that error appears in the above-identified patent and that said Letters Patent is hereby corrected as shown below:

<u>Title page,</u>
Item [56], OTHER PUBLICATIONS, delete "4-107-4●." and substitute -- 4-107-4-108. -- in its place.

Reference, "American National Standard for Electromechanical Watt-hour Meters," delete "Inc..," and substitute -- Inc., -- in its place.
Reference, "International Standard, Alternating current static watt-hour meters for active energy" insert -- " -- (opening quotes) immediately before "International"; and insert -- " -- (closing quotes) immediately after "(classes 0,2 S and 0,5 S) ,".

Reference, "International Standard, Amendment 1 to Publication 868 (1986)," insert -- " -- (opening quotes) immediately before "International"; and insert -- " -- (closing quotes) immediately after "(1986),".

Signed and Sealed this

Thirty-first Day of December, 2002

JAMES E. ROGAN
*Director of the United States Patent and Trademark Office*